(12) United States Patent
Meller et al.

(10) Patent No.: US 11,201,629 B2
(45) Date of Patent: *Dec. 14, 2021

(54) LOW LATENCY SEQUENTIAL LIST DECODING OF POLAR CODES

(71) Applicant: TSOFUN ALGORITHMS LTD., Tel Aviv (IL)

(72) Inventors: Eldad Meller, Even Yehuda (IL); Noam Presman, Givatayim (IL); Alexander Smekhov, Tel Aviv (IL)

(73) Assignee: TSOFUN ALGORITHMS LTD., Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/765,704

(22) PCT Filed: Jul. 15, 2018

(86) PCT No.: PCT/IL2018/050774
§ 371 (c)(1),
(2) Date: May 20, 2020

(87) PCT Pub. No.: WO2019/102450
PCT Pub. Date: May 31, 2019

(65) Prior Publication Data
US 2020/0295787 A1 Sep. 17, 2020

Related U.S. Application Data

(60) Provisional application No. 62/589,596, filed on Nov. 22, 2017.

(51) Int. Cl.
*H03M 13/00* (2006.01)
*H03M 13/39* (2006.01)
*H03M 13/13* (2006.01)

(52) U.S. Cl.
CPC ....... *H03M 13/3977* (2013.01); *H03M 13/13* (2013.01)

(58) Field of Classification Search
None
See application file for complete search history.

(56) References Cited

U.S. PATENT DOCUMENTS

2013/0117344 A1* 5/2013 Gross ............... H03M 13/1575
708/490
2015/0026543 A1* 1/2015 Li ....................... H03M 13/45
714/776

(Continued)

OTHER PUBLICATIONS

Tal, I., & Vardy, A. (2015). List decoding of polar codes. IEEE Transactions on Information Theory, 61(5), 2213-2226.

(Continued)

*Primary Examiner* — Mujtaba M Chaudry
(74) *Attorney, Agent, or Firm* — Browdy and Neimar, PLLC

(57) ABSTRACT

There is provided a method of recursive sequential list decoding of a codeword of a polar code comprising: obtaining an ordered sequence of constituent codes usable for the sequential decoding of the polar code, representable by a layered graph; generating a first candidate codeword (CCW) of a first constituent code, the first CCW being computed from an input model informative of a CCW of a second constituent code, the first constituent code and second constituent code being children of a third constituent code; using the first CCW and the second CCW to compute, by the decoder, a CCW of the third constituent code; using the CCW of the third constituent code to compute a group of symbol likelihoods indicating probabilities of symbols of a fourth (higher-layer) constituent code having been transmitted with a particular symbol value, and using the group of symbol likelihoods to decode the fourth constituent code.

9 Claims, 14 Drawing Sheets

(56) References Cited

U.S. PATENT DOCUMENTS

| | | | |
|---|---|---|---|
| 2015/0092886 A1* | 4/2015 | Ionita | H03M 13/2792 375/298 |
| 2015/0188666 A1* | 7/2015 | Mahdavifar | H03M 13/13 375/295 |
| 2016/0013810 A1* | 1/2016 | Gross | H03M 13/13 714/776 |
| 2017/0149531 A1* | 5/2017 | Raza | H03M 13/37 |
| 2017/0230059 A1* | 8/2017 | Giard | H03M 13/2927 |
| 2017/0366199 A1* | 12/2017 | Ge | G06F 11/1004 |
| 2017/0366204 A1* | 12/2017 | Shi | H04L 25/061 |
| 2018/0076831 A1 | 3/2018 | Johnson | |

OTHER PUBLICATIONS

Egilmez, Z. B. K., Xiang, L., Maunder, R. G., & Hanzo, L. (2019). The development, operation and performance of the 5G polar codes. IEEE Communications Surveys & Tutorials, 22(1), 96-122.

Berhault, G., Leroux, C., Jego, C., & Dallet, D. (Jan. 2015). Partial sums computation in polar codes decoding. In 2015 IEEE International Symposium on Circuits and Systems (ISCAS) (pp. 826-829). IEEE.

Chaki, P., & Kamiya, N. (May 2019). A novel design of CRC-concatenated polar codes. In ICC 2019-2019 IEEE International Conference on Communications (ICC) (pp. 1-6). IEEE.

Balatsoukas-Stimming, A., Parizi, M. B., & Burg, A. (Mar. 2015). LLR-based successive cancellation list decoding of polar codes. IEEE transactions on signal processing, 63(19), 5165-5179.

Presman, N., & Litsyn, S. (2017). Recursive descriptions of polar codes. Advances in Mathematics of Communications 11(1), 1.

Fan, Y., & Tsui, C. Y. (Jun. 2014). An efficient partial-sum network architecture for semi-parallel polar codes decoder implementation. IEEE Transactions on Signal Processing, 62(12), 3165-3179.

Sarkis, G., Giard, P., Vardy, A., Thibeault, C., & Gross, W. J. (Feb. 2016). Fast list decoders for polar codes. IEEE Journal on Selected Areas in Communications, 34(2), 318-328.

Presman, N., & Litsyn, S. (Jun. 2015). Recursive Descriptions of Polar Codes. Version 3.

Presman, N., & Litsyn, S. (Feb. 2015). Recursive Descriptions of Decoding Algorithms and Hardware Architectures for Polar Codes, version 1, pp. 1-60.

MacWilliams, F. J., & Sloane, N. J. A. (1977). The theory of error correcting codes (vol. 16). Elsevier.

T.K. Moon, "Error Correction Coding: Mathematical Methods and Algorithms", Wiley & Sons, 2005.

en.wikipedia.org/wiki/Cyclic_redundancy_check, Feb. 23, 2021.

Blokh, E. L., & Zyablov, V. V. (1974). Coding of generalized concatenated codes. Problemy Peredachi Informatsii, 10(3), 45-50.

Forney, G. D. (1965). Concatenated codes.

Zinov'ev, V. A. (1976). Generalized cascade codes. Problemy Peredachi Informatsii, 12(1), 5-15.

Dumer, I.I. (Jan. 1998). Concatenated codes and their multilevel generalizations. Handbook of coding theory.

Arikan, E. (Jul. 2009). Channel polarization: A method for constructing capacity-achieving codes for symmetric binary-input memoryless channels. IEEE Transactions on information Theory, 55(7), 3051-3073.

Tai, I., & Vardy, A. (2015). List decoding of polar codes. IEEE Transactions on Information Theory, 61(5), 2213-2226.

Hashemi, S. A., Condo, C., & Gross, W. J. (Jan. 2017) Fast simplified successive-cancellation list decoding of polar codes. In 2017 IEEE Wireless Communications and Networking Conference Workshops (WCNCW) (pp. 1-6). IEEE.

Giard, P., Sarkis, G., Balatsoukas-Stimming, A., Fan, Y., Tsui, C. Y., Burg, A., . . . & Gross, W. J. (Jun. 2016). Hardware decoders for polar codes: An overview. In 2016 IEEE International Symposium on Circuits and Systems (ISCAS) (pp. 149-152). Ieee.

* cited by examiner $r_i^{(start)}$

LL Mem for Model #0 of Outer-Code Layer #i $r_i^{(start)} + \theta_i$

LL Mem for Model #1 of Outer-Code Layer #i $r_i^{(start)} + 2\theta_i$

LL Mem for Model #2 of Outer-Code Layer #i $r_i^{(start)} + 3\theta_i$ $\vdots$ $r_i^{(start)} + (L-1)\theta_i$ LL Mem for Model #$L-1$ of Outer-Code Layer #i $r_{i+1}^{(start)}$

Fig. 11

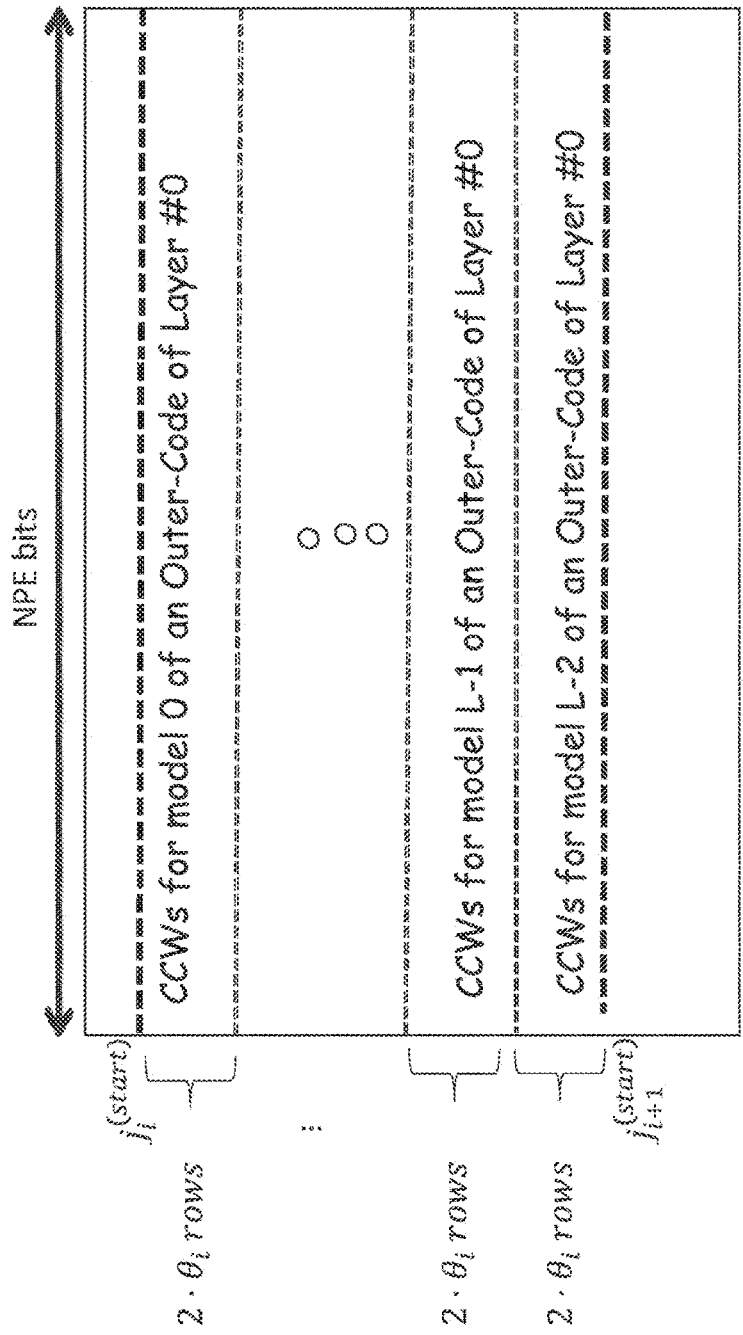

LOW LATENCY SEQUENTIAL LIST DECODING OF POLAR CODES

CROSS-REFERENCES TO RELATED APPLICATIONS

The present application claims benefit from U.S. Provisional Patent Application No. 62/589,596 filed on Nov. 22, 2017, the application being hereby incorporated by reference in its entirety.

TECHNICAL FIELD

The presently disclosed subject matter relates to error correction codes (ECCs) and, more particularly, to decoding systems for such codes.

BACKGROUND

Problems of the decoding of error correction codes have been recognized in the conventional art and various techniques have been developed to provide solutions, for example:

Generalized Concatenated Codes (GCC) are error correcting codes that are constructed by a technique, which was introduced by Blokh and Zyabolov (Blokh, E. & Zyabolov, V. "Coding of Generalized Concatenated Codes", Probl. Peredachi Inform., 1974, 10, 45-50) and Zinoviev (Zinoviev, V., "Generalized Concatenated Codes", Probl. Peredachi Inform., 1976, 12, 5-15). The construction of the GCCs is a generalization of Forney's code concatenation method (Forney G. D. J., "Concatenated Codes", Cambridge, Mass.: M.I.T. Press, 1966). A good survey on GCCs was authored by I. Dumer (I. Dumer, "Concatenated Codes and Their Multilevel Generalizations", Handbook of Coding Theory, V. S. Pless & W. C. Huffman (Eds.), Elsevier. The Netherlands, 1998).

Polar codes were introduced by Arikan (E. Arikan, "Channel polarization: A method for constructing capacity-achieving codes for symmetric binary-input memoryless channels"). Generalizations of polar codes and their decoding algorithms followed (see e.g. Presman and Litsyn, "Recursive descriptions of polar codes". Adv. in Math. of Comm. 11(1): 1-65 (2017)). A sequential list decoding algorithm for polar codes called successive cancellation list (SCL) was proposed by Tal and Vardy (Ido Tal and Alexander Vardy, "List Decoding of Polar Codes", IEEE Trans. Information Theory 61(5): 2213-2226 (2015)). Systems and hardware architectures for such decoders were also proposed (see e.g. Seyyed Ali Hashemi, Carlo Condo and Warren J. Gross, "Fast Simplified Successive-Cancellation List Decoding of Polar Codes". CoRR abs/1701.08126 (2017), also: Gabi Sarkis, Pascal Giard, Alexander Vardy, Claude Thibeault and Warren Gross, "Fast List Decoders for Polar Codes", IEEE Journal on Selected Areas in Communications 34(2): 318-328 (2016), and Pascal Giard, Gabi Sarkis, Alexios Balatsoukas-Stimming YouZhe Fan, Chi-Ying Tsui, Andreas Peter Burg, Claude Thibeault, Warren J. Gross, "Hardware decoders for polar codes: An overview", ISCAS 2016: 149-152).

The problem of re-encoding within the successive cancellation algorithm has received attention in the following papers. Note that in these papers, re-encoding is referred to as the "partial-sums problem".

G. Berhault, C. Leroux, C. Jego, and D. Dallet, "Partial sums computation in polarcodes decoding," October 2013. [Online]. Available: http://arxiv.org/abs/1310.1712

Y. Fan and C.-Y. Tsui, "An efficient partial-sum network architecture for semi-parallel polar codes decoder implementation," IEEE Trans. Signal Process., vol. 62, no. 12, pp. 3165-3179, 2014. [Online]. Available: http://ieeexplore.ieee.org/stamp/stamp.jsp?arnumber=6803952

The references cited above teach background information that may be applicable to the presently disclosed subject matter. Therefore the full contents of these publications are incorporated by reference herein where appropriate, for appropriate teachings of additional or alternative details, features and/or technical background.

GENERAL DESCRIPTION

According to one aspect of the presently disclosed subject matter there is provided a computer implemented method of recursive sequential list decoding of a codeword of a polar code, the method provided by a decoder comprising a plurality of processors, the method comprising:

a) obtaining, by the decoder, an ordered sequence of constituent codes usable for the sequential decoding of the polar code, the constituent codes being representable by a layered graph;

b) generating, by the decoder, data informative of a first candidate codeword (CCW) of a first constituent code, the first CCW being computed from an input model informative of a CCW of a second constituent code and being associated therewith, the first constituent code and second constituent code being children of a third constituent code;

c) using the data informative of the first CCW and the data informative of the second CCW to compute, by the decoder, data indicative of a CCW of the third constituent code;

d) using the data indicative of the CCW of the third constituent code to compute, by the decoder, a group of symbol likelihoods, each symbol likelihood being usable to derive a probability that a specific symbol of a fourth constituent code was transmitted with a particular symbol value, the fourth constituent code being part of a layer higher than the layer of the third constituent code, the parent of the fourth constituent code being an ancestor of the third constituent code; and e) using the group of symbol likelihoods to decode, by the decoder, the fourth constituent code.

The method according to this aspect of the presently disclosed subject matter can further comprise one or more of features (i) to (vi) listed below, in any desired combination or permutation which is technically possible:

(i) the computing a group of symbol likelihoods is executed on at least one processor of the plurality of processors.

(ii) the computing data indicative of a CCW of the third constituent code comprises generating, by the decoder, a sequence of one or more groups of ordered CCW symbols, each group of ordered CCW symbols having a group length, the symbols in a given group being generated by the decoder within a single clock cycle.

(iii) the decoder generates the sequence of groups of ordered CCW symbols in upper-to-lower order.

(iv) the at least one processor computes likelihoods for symbols of a first group of ordered CCW symbols concurrent with generation, by the decoder, of a subsequent group of ordered CCW symbols.

(v) the computing a group of symbol likelihoods comprises concurrently computing the likelihood of each symbol of a group of ordered CCW symbols on a distinct processor of the at least one processor.

(vi) the at least one processor computes likelihoods for symbols of a group of ordered CCW symbols within a clock cycle during which the decoder generated the group.

According to another aspect of the presently disclosed subject matter there is provided a decoder configured to perform recursive sequential list decoding of a codeword of a polar code, the decoder composing a memory and a plurality of processors, wherein the decoder is configured to:

a) obtain an ordered sequence of constituent codes usable for the sequential decoding of the polar code, the constituent codes being representable by a layered graph;

b) generate data informative of a first candidate codeword (CCW) of a first constituent code, the first CCW being computed from an input model informative of a CCW of a second constituent code and being associated therewith, the first constituent code and second constituent code being children of a third constituent code;

c) using the data informative of the first CCW and the data informative of the second CCW, compute data indicative of a CCW of the third constituent code;

d) using the data indicative of the CCW of the third constituent code, compute a group of symbol likelihoods, each symbol likelihood being usable to derive a probability that a specific symbol of a fourth constituent code was transmitted with a particular symbol value, the fourth constituent code being part of a layer higher than the layer of the third constituent code, the parent of the fourth constituent code being an ancestor of the third constituent code; and e) using the group of symbol likelihoods, decode the fourth constituent code.

This aspect of the disclosed subject matter can optionally comprise one or more of features (i) to (vi) listed above with respect to the system, mutates mutandis, in any desired combination or permutation which is technically possible.

According to another aspect of the presently disclosed subject matter there is provided a non-transitory program storage device readable by a processing circuitry, tangibly embodying computer readable instructions executable by the processing circuitry to perform a method of recursive sequential list decoding of a codeword of a polar code, the method comprising:

a) obtaining, by the decoder, an ordered sequence of constituent codes usable for the sequential decoding of the polar code, the constituent codes being representable by a layered graph;

b) generating, by the decoder, data informative of a first candidate codeword (CCW) of a first constituent code, the first CCW being computed from an input model informative of a CCW of a second constituent code and being associated therewith, the first constituent code and second constituent code being children of a third constituent code;

c) using the data informative of the first CCW and the data informative of the second CCW to compute, by the decoder, data indicative of a CCW of the third constituent code;

d) using the data indicative of the CCW of the third constituent code to compute, by the decoder, a group of symbol likelihoods, each symbol likelihood being usable to derive a probability that a specific symbol of a fourth constituent code was transmitted with a particular symbol value, the fourth constituent code being part of a layer higher than the layer of the third constituent code, the parent of the fourth constituent code being an ancestor of the third constituent code; and e) using the group of symbol likelihoods to decode, by the decoder, the fourth constituent code.

Among the advantages of certain embodiments of the presently disclosed subject matter are low latency decoding, low power consumption, and lower memory utilization compared to prior art solutions.

BRIEF DESCRIPTION OF THE DRAWINGS

In order to understand the invention and to see how it can be carried out in practice, embodiments will be described, by way of non-limiting examples, with reference to the accompanying drawings, in which;

FIG. 11 illustrates an exemplary layout of rows in a region of the memory table for storing likelihood data of multiple input models which pertain to a single outer code, according to some embodiments of the presently disclosed subject matter;

FIG. 14 illustrates an exemplary layout of rows in a region of the memory table for storing codeword data of multiple input models which pertain to a single outer code, according to some embodiments of the presently disclosed subject matter;

DETAILED DESCRIPTION

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "computing", "representing", "comparing", "generating", "assessing", "matching", "updating" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the "processor", "processing element", and "decoder" disclosed in the present application.

The terms "non-transitory memory" and "non-transitory storage medium" used herein should be expansively construed to cover any volatile or non-volatile computer memory suitable to the presently disclosed subject matter.

The operations in accordance with the teachings herein may be performed by a computer specially constructed for the desired purposes or by a general-purpose computer specially configured for the desired purpose by a computer program stored in a non-transitory computer-readable storage medium.

Embodiments of the presently disclosed subject matter are not described with reference to any particular programming language. It will be appreciated that a variety of programming languages may be used to implement the teachings of the presently disclosed subject matter as described herein.

Figure 1:
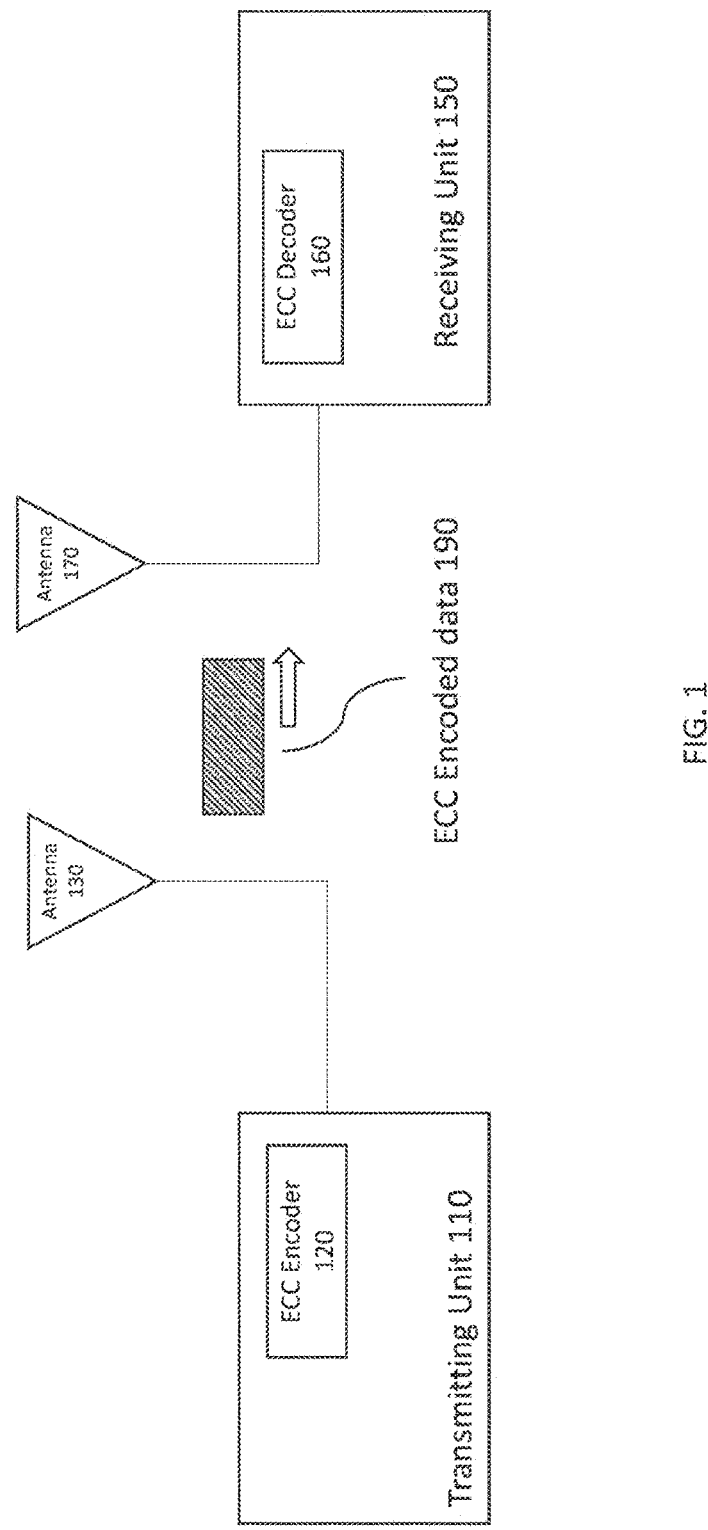
FIG. 1 illustrates a block diagram of a wireless communications network employing an ECC Decoder configured in accordance with certain embodiments of the presently disclosed subject matter.

Bearing this in mind, attention is drawn to FIG. 1 illustrating a block diagram of a wireless communications network employing an Error Correction Code (ECC) Decoder configured in accordance with certain embodiments of the presently disclosed subject matter.

The system includes a transmitting unit (110) configured to communicate wirelessly with a receiving unit (150). Wireless communication between transmitting unit (110) and receiving unit (150) can utilize, for example, a cellular technology capable of carrying, for example, data packets, and the wireless signal can be transmitted via antenna (130) and received over antenna (170). The wireless signal can carry, for example, packets such as the ECC encoded data (190) packet.

The wireless signal can be affected by signal dissipation and various kinds of electromagnetic interference which can result in errors occurring in the data received at the receiving unit (150). By encoding using an Error Correction Code (such as Arikan's polar code) at the transmitter and then decoding at the receiver, such errors can be corrected. The communication system of FIG. 1 can thus be more resistant to interference and less error-prone than a system that does not use an ECC.

The transmitting unit (110) can contain an ECC encoder (120). The ECC encoder (120) processes the data that arrives for transmission to the receiving unit (150) (known as the information word), and can process it according to an Error Correction Code such as Arikan's polar code (resulting in a codeword) before transmission. Similarly, the receiving unit (150) can contain an ECC decoder (160). The ECC decoder (160) can process the codeword that arrives at the receiving unit (150) from the transmitting unit (110) (such as the ECC encoded data (190)), and can process it according to the Error Correction Code used at the ECC encoder (120) to restore the original information word as further detailed below.

It is noted that the teachings of the presently disclosed subject matter are not bound by the wireless communications system described with reference to FIG. 1. Equivalent and/or modified functionality can be consolidated or divided in another manner and can be implemented in any appropriate combination of software with firmware and/or hardware and executed on a suitable device. The wireless communications system can be a standalone network entity, or integrated, fully or partly, with other network entities. It will be clear to one skilled in the art how an ECC decoder can be employed in other embodiments such as wired communication, storage systems etc.

Figure 2:
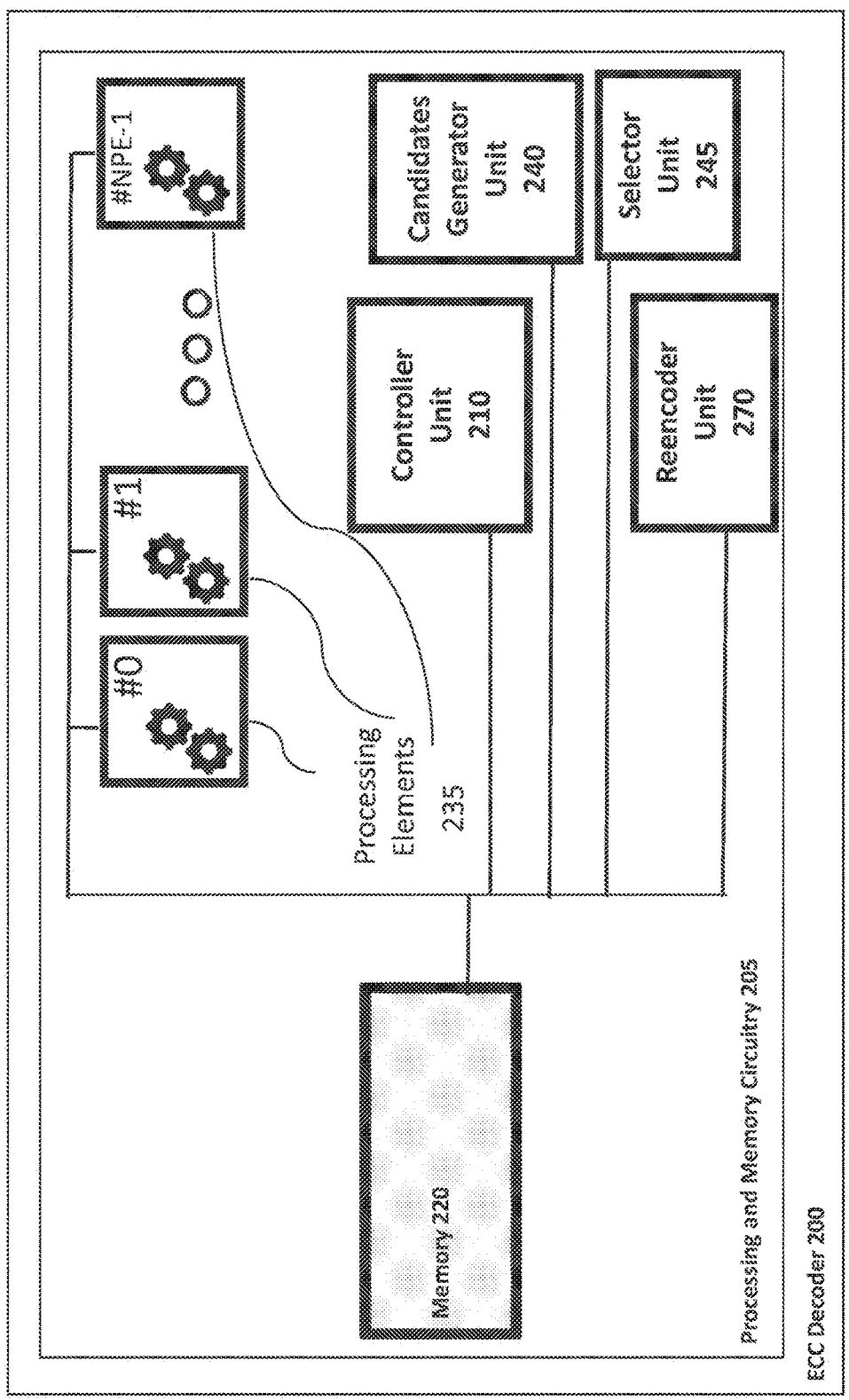
FIG. 2 illustrates a block diagram of an ECC Decoder and its components according to some embodiments of the presently disclosed subject matter.

FIG. 2 is a block diagram of an Error Correction Code (ECC) decoder (200) and its components according to some embodiments of the presently disclosed subject matter.

The illustrated. ECC Decoder system can include a processing and memory circuitry (205) including a processor (not shown) operatively coupled to a memory (220). Processing and memory circuitry (205) can further include zero or more specialized processing elements (235) operably connected to memory (220).

A processing element (235) can be a hardware-based electronic device with data processing capabilities, such as, for example, a general purpose processor, a specialized Application Specific Integrated Circuit (ASIC), a single core in a multicore processor etc. A processing element (235) can also consist, for example, of multiple processors, multiple ASICs, virtual processors, combinations thereof etc. The processing elements (235) can be identical to one another, or they can differ from each other in terms of architecture, processing capacity, clock rate etc. The abbreviation NPE denotes the number of processing elements (235) contained in the processing and memory circuitry (205).

A processing element (235) can be configured to perform, for example, tasks for decoding of constituent codes as part of list sequential decoding of a polar code codeword—as will be described in detail below with reference to FIG. 7. In some embodiments of the currently disclosed subject matter, a processing element (235) can perform computation of the likelihoods of particular symbols of the original information word having particular symbol values—as will be described in detail below with reference to FIG. 7.

The memory (220) can be, for example, any kind of volatile or non-volatile storage, and can include, for example, a single physical memory component or a plurality of physical memory components.

The memory (220) can be configured to, for example, store various data used in the computation of a decoded codeword. Such data can include, for example, constituent code symbol likelihood data, decoded constituent code codewords (i.e. estimations of original information words of constituent codes), and reencoded constituent code codewords (created, for example, by applying an inner mapping function to decoded information words, and utilized, for example, to decode subsequent constituent codes).

As will be further detailed with reference to FIG. 8, the processing and memory circuitry (205) can be configured to execute several functional modules in accordance with computer-readable instructions implemented on a non-transitory computer-readable storage medium. Such functional modules are referred to hereinafter as comprised in the processing and memory circuitry. These modules can include, for example, controller unit (210), candidates generator unit (240), selector unit (245), and reencoder unit (270).

The processing and memory circuitry (205) can comprise a controller unit (210). The controller unit (210) can be configured to receive a codeword of a particular Error Correction Code over an external interface (not shown), and store it into the Memory (220). The controller unit (210) can subsequently initiate and orchestrate a process to decode the codeword so that, for example, an estimation of the original codeword (i.e. an estimation of the word as initially produced by the encoder unit (120)) is available in the memory (220).

In some embodiments of the presently disclosed subject matter, an estimation of the original information word (i.e. an estimation of the word as passed initially into the encoder unit (120)) can be available in the memory (220) upon completion of the decoding. This process will be described in detail below with reference to FIG. 8.

It is noted that in some cases it can be sufficient for a decoding operation to generate, for example, an estimation of the original codeword prepared for transmission—without the generating or maintaining an estimation of the original information word. It is further noted that in the case of, for example, systematic encoding, the symbols of the original information word appear among the symbols of the codeword, so that an estimation of information word symbols can be determined simply by selecting the appropriate symbols from an estimation of the original codeword transmitted.

The processing and memory circuitry (205) can include a candidates generator unit (240), configured, for example, to construct information word candidates according to, for example, symbol likelihood data written to memory by a processing element (235)—as will be described in detail below with reference to FIG. 8.

The processing and memory circuitry (205) can include a selector unit (245), configured to, for example, select the "best-fit" information word candidates for continued processing—as will be described in detail below with reference to FIG. 8.

The processing and memory circuitry (205) can include a reencoder unit (270), configured to, for example, apply an iterative mapping so as to convert the selected candidate information words back into codeword format, in preparation for the decoding of the next constituent code—as will be described in detail below with reference to FIG. 8.

It is noted that the teachings of the presently disclosed subject matter are not bound by the ECC decoder system described with reference to FIG. 2. Equivalent and/or modified functionality can be consolidated or divided in another manner and can be implemented in any appropriate combination of software with firmware and/or hardware and executed on a suitable device.

Figure 3:
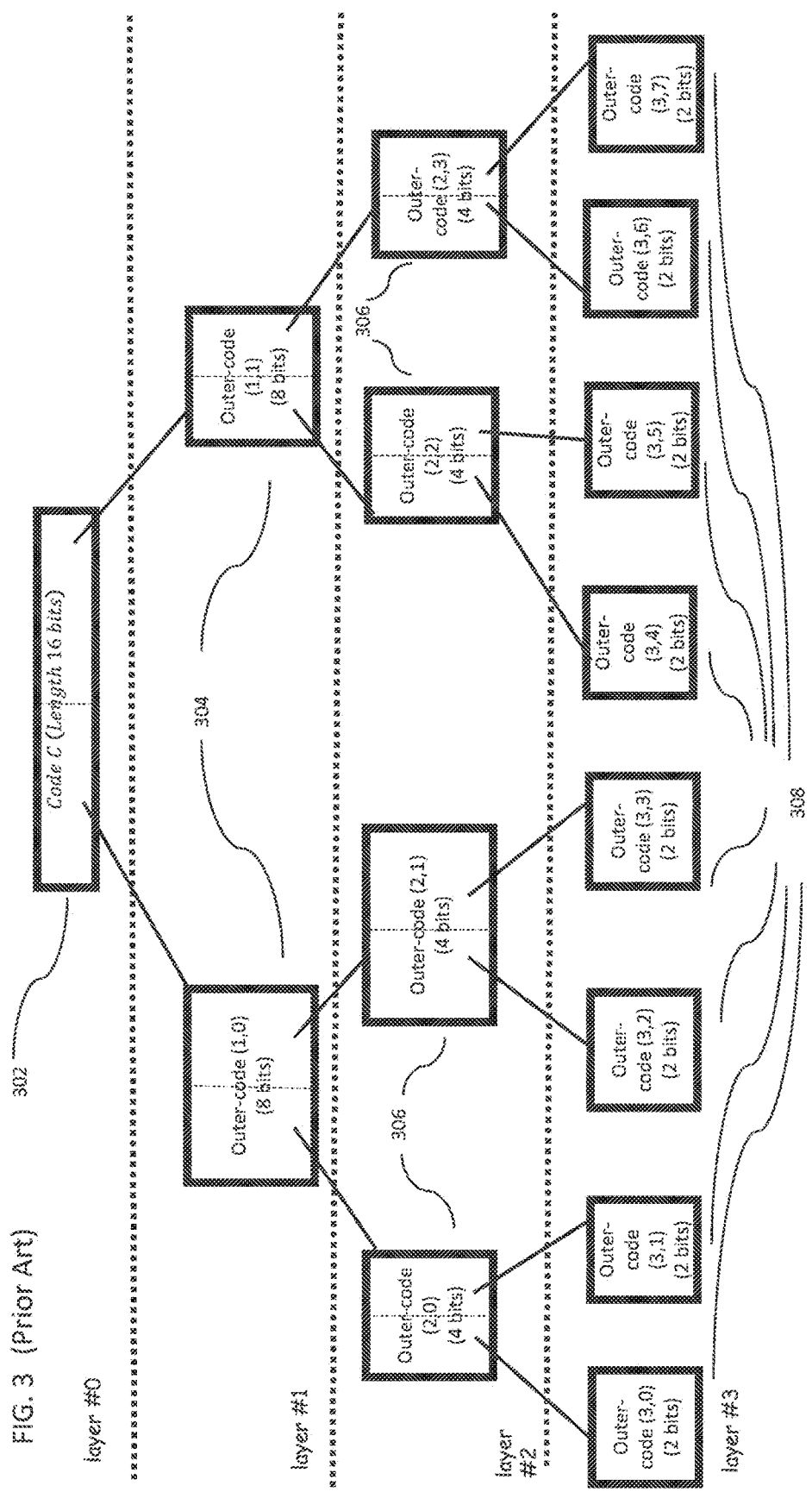
FIG. 3 illustrates an exemplary logical representation for a 16-bit generalized concatenated code in accordance with certain embodiments of the presently disclosed subject matter.

FIG. 3 illustrates, by way of non-limiting example, a layered factor graph representation of a 16 bit recursive generalized concatenated code (such as, for example, Arikan's polar code).

In a generalized concatenated code (GCC), a complex code is constructed, for example, from a group of $N_{outer}$ outer-codes (also termed "constituent codes")—the codeword of each of the constituent codes being of length $L_{outer}$ symbols (for example: bits). An inner-code (with associated inner mapping function $F_{inner}$ and codeword length $L_{inner}$) is also, for example, utilized. A codeword of the GCC can be generated by creating a matrix of $N_{outer}$ rows and $L_{outer}$ columns wherein each row is a codeword of the outer-code—and then applying $F_{inner}$ to each of the $L_{outer}$ columns of the matrix.

In a recursive GCC, a GCC encoding operation can be performed multiple times—with the output of one encoding operation serving as input to a subsequent encoding. In the recursive structure, the constituent codes are themselves generalized concatenated codes. Each one of the $N_{outer}$ constituent codes itself comprises $N'_{outer}$ codes each of length $L'_{outer}$ where $L'_{outer} < L_{outer}$. If the inner mapping length is $L'_{inner}$, then $N_{outer} = L'_{inner} \cdot L'_{outer}$.

Arikan's polar code can be regarded as a non-limiting example of a recursive GCC, as a polar code of a particular length can be formalized as a concatenation of several smaller polar codes in conjunction with a kernel mapping (inner code).

More specifically: an Arikan polar code (over a binary alphabet) of length $N=2^m$ bits (with $m>1$) can be represented as 2 outer polar codes of length $2^{m-1}$ that are concatenated using the inner code g(u), wherein:

the two outer codes are defined as:

outer-code #i:

$$[\gamma_{i,j}]_{j=0}^{j=N/2-1} = g^{(m-1)}\left(u_{i \cdot \left(\frac{N}{2}\right)}^{(i+1) \cdot \left(\frac{N}{2}\right)-1}\right) \text{ for } i = 0, 1$$

$g^{(m)}(\cdot)$ is recursively defined as:
For m=1:
$g^{(l)}(u)=g(u)=[u_0+u_1, u_1]$
For m>1:

$$g^{(m)}(u) = x_o^{N-1}$$

where $$[x_{2j}, x_{2j+1}] = [\gamma_{0,j} + \gamma_{1,j}, \gamma_{1,j}] \; j = 0, 1, 2, \ldots, \frac{N}{2} - 1 \text{ and}$$

$$[\gamma_{i,j}]_{j=0}^{j=N/2-1} = g^{(n-1)}\left(u_{i \cdot \left(\frac{N}{2}\right)}^{(i+1) \cdot \left(\frac{N}{2}\right)-1}\right) \text{ for } i = 0, 1$$

and $u_0^{N-1}$ bits are the input information bits.

FIG. 3 consists of 4 layers (numbered 0 to 3), in which each layer contains nodes corresponding to the constituent codes of one recursion of the 16-bit generalized concatenated code being illustrated. The nodes are arranged in a hierarchy, where the nodes in a lower layer are constituent codes of particular nodes in the layer above. The solid lines between the nodes of different layers in FIG. 3 indicate which lower layer codes are constituents of which higher a codes (and in which positions in the higher layer codes).

Thus: Layer 0 includes a single node (302) corresponding to the 16-bit codeword. Layer 1 includes 2 nodes (304) corresponding to the two 8-bit outer codewords which are constituent codes of the 16-bit codeword. Layer 2 includes 4 nodes (306) corresponding to the 44-bit outer codewords each of which is a constituent code of one of the 8-bit codewords. The nodes (308) in layer 3 correspond to 2-bit codewords each of which is a constituent code of one of the 4-bit codewords. The 2-bit codewords in layer 3 do not include constituent codes themselves.

In FIG. 3 the outer codewords are labelled according to their layer and the order of appearance in the higher layer code e.g. "Outer Code (2,0)" refers to the codeword in layer 2 that constitutes the first outer-code of Outer Code (1,0).

"Outer Code (2,0)" can be referred to as, for example, the parent code of "Outer Code (3,0)" and "Outer Code (3,1)". Similarly "Outer Code (3,0)" and "Outer Code (3,1)" can be referred to as, for example, child codes of "Outer Code (2,0)". "Outer Code (3,0)" and "Outer Code (3,1)" can be referred to as, for example, sibling codes of each other. "Outer Code (1,0)" (for example) can be referred to as an ancestor code of—for example—"Outer Code (2,0)", "Outer Code (3,0)", "Outer Code (3,1)" etc.

The hierarchy of outer codes and layers illustrated in FIG. 3 can be utilized by, for example, sequential list decoding methods described below with reference to FIGS. 4-5 and FIG. 6. In particular, the hierarchy can indicate what sequential decoding tasks can be carried out and in what sequence—as will be described in more detail below with reference to FIGS. 4-5 and FIG. 6.

Figure 4:
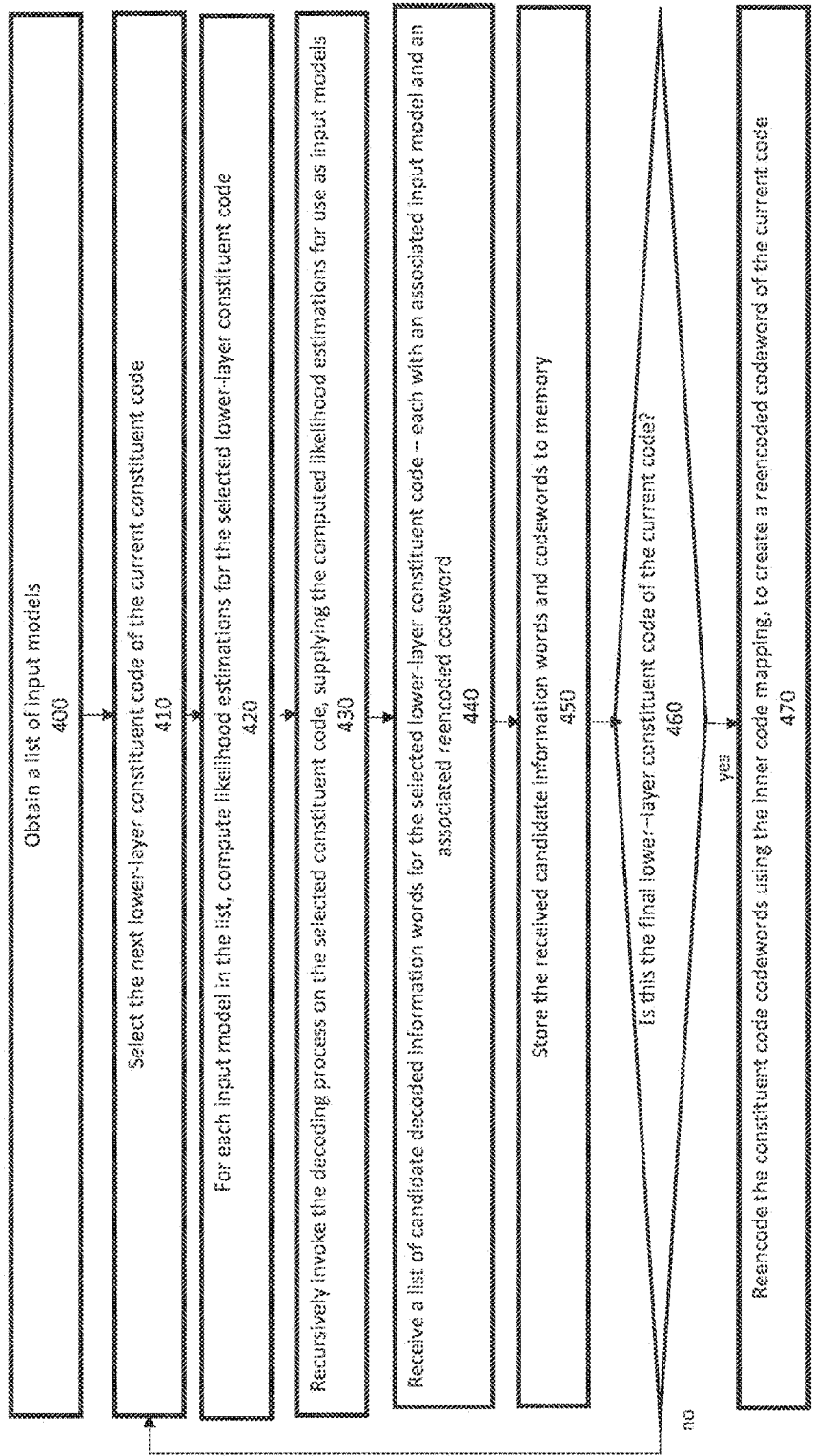
FIG. 4 illustrates a generalized flow-chart describing a prior art process for recursive sequential list decoding of a generalized concatenated code.

Attention is now directed to FIG. 4, which provides an exemplary flow diagram describing a prior art process for recursive sequential list decoding (with list size L) of a GCC for a received codeword of length N.

The term "sequential list decoding" can refer, by way of non-limiting example, to a decoding method in which segments of a codeword are decoded in a predefined sequence, and in which a certain number of decoding candidates (known as the "list size") is maintained as the decoding progresses. After the entire codeword is decoded, a single candidate from the list can be selected.

The prior art process illustrated in FIG. 4 is described, by way of non-limiting example, in section 4 of Presman and Litsyn, "Recursive descriptions of polar codes". Adv. in Math. of Comm. 11(1): 1-65 (2017) which is hereby incorporated by reference. In this prior art process, a task that decodes a codeword can recursively invoke a series of decodings of constituent codewords.

For convenience, the process is herein described according to an embodiment utilizing a general purpose computing system with a processor and memory, but it will be clear to one skilled in the art that the process is equally applicable for other platforms. For convenience, the process is herein described for a binary alphabet, but it will be clear to one skilled in the art that the process is equally applicable for a non-binary alphabet.

For each sequentially decoded constituent code, the decoding task utilizes a list of "input models" which provide the task with estimations of the data received from the communication medium—as modified according to the results of decoding of previous constituent codes (as will be described in detail below).

For a constituent code of length N, an input model, can, for example, include:
A vector $LLH_0$ of length N in which each vector element contains an estimated likelihood that the corresponding transmitted bit of the codeword was 0.
A vector $LLH_1$ of length N in which each vector element contains an estimated likelihood that the corresponding transmitted bit of the codeword was 1.

A likelihood value can be represented in the vectors as, for example, a floating point number between 0 and 1, a natural logarithm, or some other representation or an approximation thereof. Likelihood values can also be represented, as, for example, the ratio between the likelihood of 0 and the likelihood of 1("likelihood ratio"), or as a logarithm of the ratio between the likelihood of 0 and the likelihood of 1 ("log-likelihood ratio) etc. The system (for example: the processor) can perform, for example, computations of likelihoods using one representation and, for example, store the likelihoods using a different representation.

There can be one input model available, or there can be more than one input model available to be used by the task.

An input model can be created from, for example, data received from a physical receiver attached, for example, to a communication medium. For example, in the case of decoding a codeword of a GCC that is represented at the highest layer of the layered factor graph representation (as described above with reference to FIG. 3), an invoking task can create an input model based on bit estimations from signals read directly from the communication medium receiver. In this case there can be a single input model that represents the likelihoods that signals observed at a receiver correspond to transmitted 0 or transmitted 1.

In the course of the sequential list decoding process, a task decoding a higher layer constituent code (as described above with reference to FIG. 3) can also create input models to be used by recursively invoked tasks decoding constituent codes of the layer below. In this case, the invoking task can build such new input models based on, for example:
the re-encoded candidate decoded information words resulting from the decoding of the previous constituent code
the input models that were used to generate those re-encoded candidate decoded information words (i.e. specific input models from the set of input models supplied to the previous constituent code decoding)
This process is described in detail below.

Early in the sequential list decoding process, there can be, for example, a small number of input models which correspond to the small number of constituent codes which have been estimated at that stage. Later in the sequential list decoding process, there can be, for example, L input models (where L is a maximum list length value used by the sequential decoding process) wherein each input model has an association with a candidate decoded information prefix in a list of L candidates being maintained by the task.

As a prerequisite for the sequential list decoding of a particular constituent code using the recursive process of FIG. 4, the system (for example: the processor) can receive (400) a list of input models, where each input model specifies the likelihood of each bit in the transmitted vector being a 0 or 1, given, for example, the signaling data detected on the communication medium and, for example, according to an associated candidate decoded information prefix.

To begin recursive sequential list decoding (e.g. on the first iteration of the iterative loop), the system (for example: the processor) can select (410) the next constituent code from which the current code is derived—for example: the first constituent code from the layer below as indicated in a layered graph of the code. Considering as a non-limiting example the decoding of the code (1,0) in layer 1 of FIG. 3, the first constituent code (and thus the one that will be selected) is outer code (2,0) in layer 2. In the next iteration outer code (2,1) will be selected.

To prepare for the recursive step, the system (for example: the processor) can next prepare (420) likelihood estimations for the bits of the selected constituent code (i.e. of the next lower layer) according to the input models and any previously decoded constituent codes. The system (for example: the processor) can prepare separate likelihoods according to each of the received input models (i.e. the received input models of the current code), and can create an association (for example: in memory) between the prepared likelihoods structure and the received input model from which the likelihoods structure was generated.

In some embodiments of the presently disclosed subject matter, the vector of likelihood values for a selected constituent code for a given input model j can be calculated according to the following formula:

$$\tilde{\Lambda}_{r,t}^{(j)} = \log(Pr(Y=y, \{\gamma_{0,t} = \hat{\gamma}^{(j)}_{0,m}, \gamma_{1,t} = \hat{\gamma}^{(j)}_{1,t}, \ldots, \gamma_{s-1,t} = \hat{\gamma}^{(j)}_{s-1,t}\}, \text{Model}\sigma(j) | \gamma_{s,t} = r))$$

where:
  r indicates a possible symbol value (i.e. 0 or 1 for a binary alphabet)
  t indicates the index of the symbol in a constituent codeword
  s denotes is the index for the selected constituent code within the current layer
  Pr( ) denotes probability
  (Y=y) represents the event of the received media signals random variable Y equalling their received value y
  $\gamma_{i,t}$ denotes the constituent codeword's symbol of the transmitted codeword, where i is an index for an outer code within the current layer, and t indicates the index of the symbol in the outer-code codeword
  $\hat{\gamma}_{i,t}^{(j)}$ denotes the computed outer code matrix under input model j, where i is an index for an outer code within the current layer, and t indicates the index of the received symbol in the outer-code codeword
  Model σ(j) denotes the information prefix associated with the input In this example, the likelihood matrix value is represented as a logarithm, however it will be evident to one skilled in the art that the likelihood matrix value can also be represented as a floating point value between 0 and 1 or some other representation.

Figure 5:
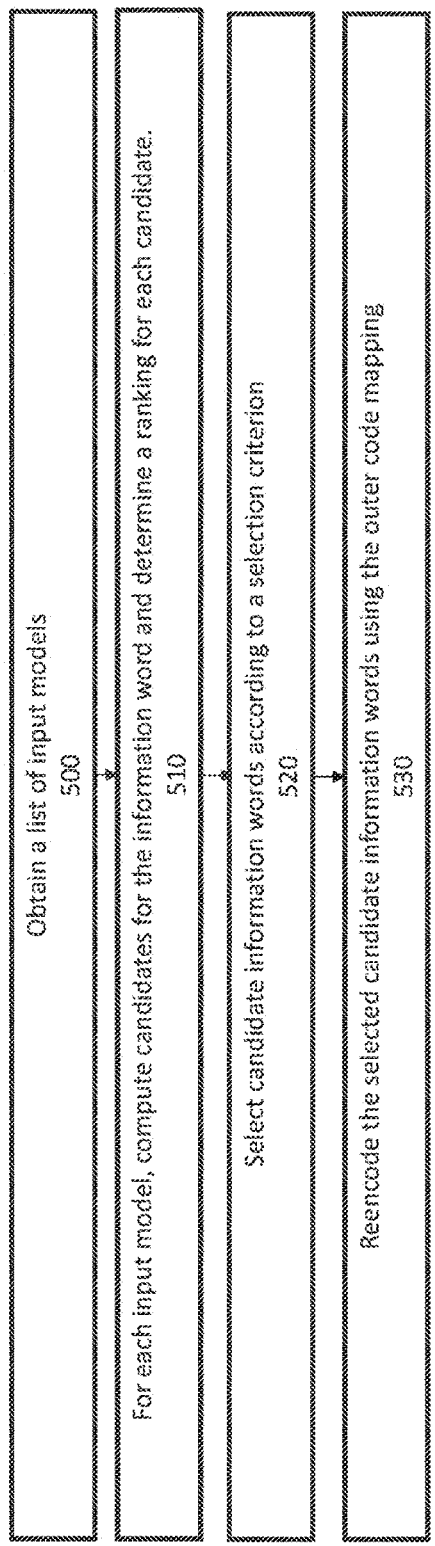
FIG. 5 illustrates a generalized flow-chart describing the recursion base case for a prior art process for recursive sequential list decoding of a generalized concatenated code.

At the recursive step, a decoding process can be invoked (430) on the selected constituent code (resulting in, for example, a recursive invocation of the FIG. 4 process or—in the case where the constituent code is in the lowest layer—the FIG. 5 process. These newly calculated likelihood estimation vectors can be supplied to the recursively invoked task for use as input models. Thus, by way of non-limiting example, in a case of decoding of the code (1,0) in layer 1 of FIG. 3, the recursive step can invoke a new recursive instance of the FIG. 4 process on outer code (2,0) in layer 2.

Upon completion of the recursive invocation of the decoding process, the system (e.g. the processor) can receive (440), for example:
  a list of candidate decoded information words for the selected constituent code (for example: L candidates). These are herein termed candidate information words (CIWs).
  Additional information for each CIW, for example:
    an indication of which likelihood vector of the supplied list was used to generate the CIW
    a codeword corresponding to the CIW (i.e. a reencoding of the CIW). This codeword is herein termed a candidate codeword (CCW). The CCW can be used, for example, in decoding the next constituent code.

Having received the results of the recursive invocation, the system (for example: the processor) can store (450) CIWs and CCWs to, for example, memory (220).

The system (for example: the processor) can next determine (460) if there is an additional constituent code from the layer below which has not yet been decoded. If so, then this code can be selected (410) and the process can repeat itself.

When the constituent codes (of the current code) from the layer below have all been decoded, the process can, for example, reencode (470) (according to the inner code mapping) each of the final set of reencoded selected candidate information words, so as to provide codeword input for the subsequent decoding task in a higher layer.

Attention is now directed to FIG. 5, which provides an exemplary flow diagram describing a prior art process for decoding of a codeword in the recursion base case. This base case can correspond to the decoding of constituent codes shown in the lowest layer of FIG. 3 (constituent codes in the lowest layer are hereforward termed "leaf" constituent codes).

To begin the decoding of the constituent code, the system (for example: a processor) can obtain (500) a list of input models to be utilized. The system (for example, a processor) can obtain these from, for example, the memory where they were written by an invoking task.

Next, the system (for example, the processor), can compute (510) candidate information words for the constituent code and can determine rankings for candidates according to the input models.

In some embodiments of the presently disclosed subject matter, the system (for example, a processor) can compute the ranking of each possible leaf code candidate information word under each supplied input model. By way of non-limiting example, in the case of a 2 bit polar code (with no frozen bits), the rankings for information words 00, 01, 10, and 11 under each input model can be computed.

A ranking can be a number that indicates the quality likelihood of a candidate decoded information word. By way of non-limiting example, the ranking can be identical with, an estimation of, or otherwise based on the "path metric". The path metric of a particular candidate information word u corresponding to a codeword c can be defined as the likelihood that the observed data (as received from the communication medium) would result from the transmission of codeword c corresponding to information word u introduced into the encoder before transmission on the communication medium.

In some embodiments of the presently disclosed subject matter, the path metric is represented using a logarithm—which case it can be computed according to the following formula:

$$PM(c) = \log(Pr(Y=y|X=c))$$

where Y is a received channel vector, X is a transmitted vector and Pr( ) indicates probability. Throughout the decoding algorithm the PM may be computed for each candidate information prefix, and as such may indicate the likelihood of having transmitted a plurality of codewords with a certain information prefix. As the algorithm progresses and the decided information prefix grows, the set of possible codewords is correspondingly reduced, until a the final decision is reached in which the entire information word, and therefore its (single) codeword representation, is determined.

By way of non-limiting example, in the case of a polar code, the path metric can be computed according to the formulae give, in section 3 of Balatsoukas-Stimming et, al. "LLR-Based successive cancellation list decoding of Polar Codes" IEEE Trans. Signal Proc., 63 (2015), 5165-5179.

After the candidate information words with their rankings have been generated, the system (for example, the processor) can select (520) some number (for example, L) of the candidate information words (together with their associated input models) for further processing according to some method. For example, the L information word candidates with the top rankings can be selected.

It is noted that even if the process generally selects L candidates, early in the operation of the recursive process the total number of possible candidates might be a number smaller than L.

Next, the system (e.g. the processor) can compute a reencoding (530) of each of the selected candidate information words (according to the outer code mapping), resulting in a list of reencoded selected candidate code words corresponding to the selected candidate information words. For each reencoded selected candidate information word, the system (e.g. the processor) can also record which input model was used to generate the candidate and make this data available in memory for use by an invoking task.

In some embodiments of prior art methods, the decoding of a codeword in the recursion base case can directly generate candidate codewords (CWs) with associated rankings—without first computing candidate information words. In such cases, the system (e.g. the processor) selects CWs rather than CIWs, and does not perform reencoding. Such methods can be useful, for example, where systematic encoding is employed—as in such cases it can be unnecessary to maintain the original information word in memory.

Figure 6:
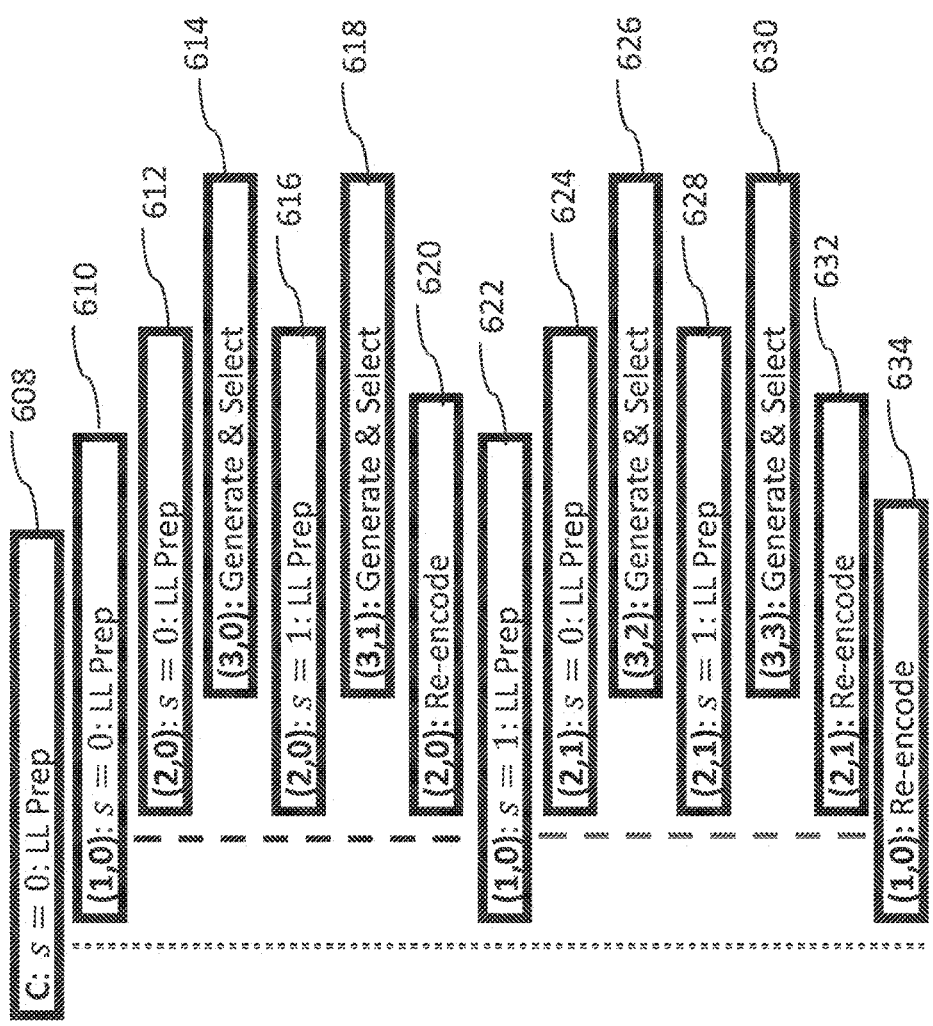
FIG. 6 illustrates a time diagram showing tasks of sequential list decoding taking place concurrently or sequentially on specific hardware, according to certain implementations of the presently disclosed subject matter.

Attention is now drawn to FIG. 6, which illustrates a time diagram showing tasks of sequential list decoding taking place concurrently or sequentially on specific hardware, according to certain implementations of the presently disclosed subject matter.

For convenience, three types of tasks are illustrated: (i) Likelihood preparation (ii) generation of codewords and selection of candidates decoding paths, and (iii) re-encoding operations. These tasks can be performed, by way of non-limiting example, as described above with reference to FIGS. 4-5. For each operation, the ECC on which the algorithm operates is denoted using the notation of FIG. 3. For this example, the following assignment of rates to layer #3 outer-codes is assumed:

| Rate | Outer-Code |
|---|---|
| 0 | (3, 0) |
| 0.5 | (3, 1), (3, 2) |
| 1 | (3, 3), (3, 4), (3, 5), (3, 6), (3, 7) |

Moreover, it is assumed that $L_{in}=1$ and L=8 (maximum list size).

1) Task 608: given the input likelihoods, the processing elements (235) calculate the inputs to the decoder of (1,0) outer-code. It is noted that in some embodiments of the presently disclosed subject matter, at this stage the processing elements (235) only need the input likelihoods and not codewords. It is further noted that because there are eight realizations of the inner code in C (each one of length two bits) the system can use at most eight processing elements (235) simultaneously to perform this task. The resulting likelihoods can be stored in memory (220).
2) Task 610: list sequential decoding of outer-code (1,0) is invoked. Thus, the next operation is to compute input likelihoods for the decoding task of outer-code (2,0). Being of length eight bits, there are four realizations of the inner code (each one of length two bits) in outer-code (2,0) and as a consequence the system can use at most four processing elements (235) simultaneously to perform this task. The likelihoods results can be stored in memory (220).
3) Task 612: list sequential decoding of outer-code (2,0) is invoked. Thus, the next operation is to compute input likelihoods for the decoding task of outer-code (3,0). Being of length four bits, there are two realizations of the inner code (of length two bits) in outer-code (3,0) and as a consequence the system can use at most two processing elements (235) simultaneously to perform this task.
4) Task 614: decoding of outer-code (3,0) is invoked. Outer-code (3,0) is length two bits code of rate 0 ("leaf code"), As such, it has only one valid codeword that can be generated by the Candidates Generator Unit (240) and can be approved by the selector of the Selector Unit (245). The codeword can be stored in memory.
5) Task 616: calculates the input likelihoods to outer-code (3,1) using the processing elements (235) and the codeword generated in Task 614 above. Results can be transferred to, for example, Candidates Generator Unit (240).
6) Task 618: decodes outer-code (3,1) Outer-code (3,1) is length two bits code of rate 0.5. As such it has only two valid codewords that may be generated by the Candidates Generator Unit (240) and may be approved by the Selector Unit (245). The codewords can be stored in memory.
7) Task 620: Reencoder Unit (270) employs the inner mapping of code (2,0) and can store the two results (each one corresponding to a different candidate) in memory.
8) Task 622: prepares likelihood inputs for outer-code (2,1) in decoding of outer-code (1,0), using the input likelihoods and the two codewords of code (2, 0) from memory. Since (1,0) is of length eight bits, there may be four realizations of inner code (each one of length two bits) in outer-code (1,0) and therefore at most four processing elements (235) can be simultaneously used to perform this task for each list item. The two results can be stored in memory.
9) Task 624: list sequential decoding of outer-code (2,1) has been invoked using LL memory in order to compute input LLs for the decoding task of outer-code (3,2). Outer-code (2,1) is of length four bits, therefore there are two realizations of the inner code (each one of length two bits) and consequently at most two processing elements (235) (per list option) my be used simultaneously to perform this task. It is assumed that the resultant LL matrix is transferred to, for example, Candidates Generator Unit (240) for candidate generation.
10) Task 626: for each one of the two decoding paths (information prefixes), the Candidates Generator Unit (240) suggests two possible codewords for outer-code (3,2) (because it has rate 0.5) resulting in a total of four outcomes. The Selector Unit (245) can approve them all (because there are still less than L=8 candidates) and the memory can be updated. Resultant codewords of (3,2) can be stored in memory.
11) Task 628: prepares the likelihood inputs to the decoder of outer-code (3,3) as part of decoding outer-code (2,1). likelihood preparation (for outer-code (3,3)) is done by processing elements (235) using likelihoods and codewords read from memory.
12) Task 630: for each of the four decoding paths, the Candidates Generator Unit (240) evaluates four possibilities for outer-code (3,3) codewords (because it is of rate 1) resulting in a total of 16 possibilities. The Selector Unit (245) may keep the best eight options (e.g. those that have maximum ranking, such as path metric) and the outcomes can be stored to codeword memory, 13) Task 632: Reencoder Unit (270) applies the inner mapping of code and can store the eight results in memory.

14) Task 634: Reencoder Unit (270) applies the inner mapping of code (1,0) and can store the eight results in memory.

As is evident from the sequence of tasks listed in FIG. 6, the method outlined in FIGS. 4-5 performs likelihood computations for at most a single constituent code at any given time instance. In other words, all processing elements 235 performing likelihood computations work on the same constituent code one outer-code. Parallelized processing can be used, for example, to: (a) compute different parts of the likelihood matrix (e.g. different columns) on different processing elements 235 simultaneously; (b) compute likelihood data from different list candidates on different processing elements 235 simultaneously—though the parallelism of (b) can be difficult to utilize in practice as it can require reading from separate memory rows and can potentially cause delayed reads.

The sequence of tasks listed in FIG. 6 further demonstrates that the re-encoding operations may introduce considerable delay to the list sequential decoding algorithm. This is because likelihood computations for constituent codes other than the first code of a particular parent code (for example tasks 622) requires the constituent code candidate codewords in order to generate the likelihood data.

Additionally, there are cases in which re-encoding operations are performed consecutively (e.g. 632 and 634). These cases correspond to the decoding of a constituent code which is the final constituent code of a particular parent code, with the parent code also being the final constituent code of its parent code. Those consecutive re-encoding operations introduce even more latency into the decoding and may result in redundant use of memory storage.

In some embodiments of the current subject matter, likelihood computation can be performed using an alternative implementation based on particular properties of polar codes. As a consequence, reencoding can be executed in parallel with likelihood computation, which can result in reduced decoding latency (in particular in the case of consecutive reencode operations) and more efficient memory usage as will be detailed below with reference to FIG. 8.

Figure 7:
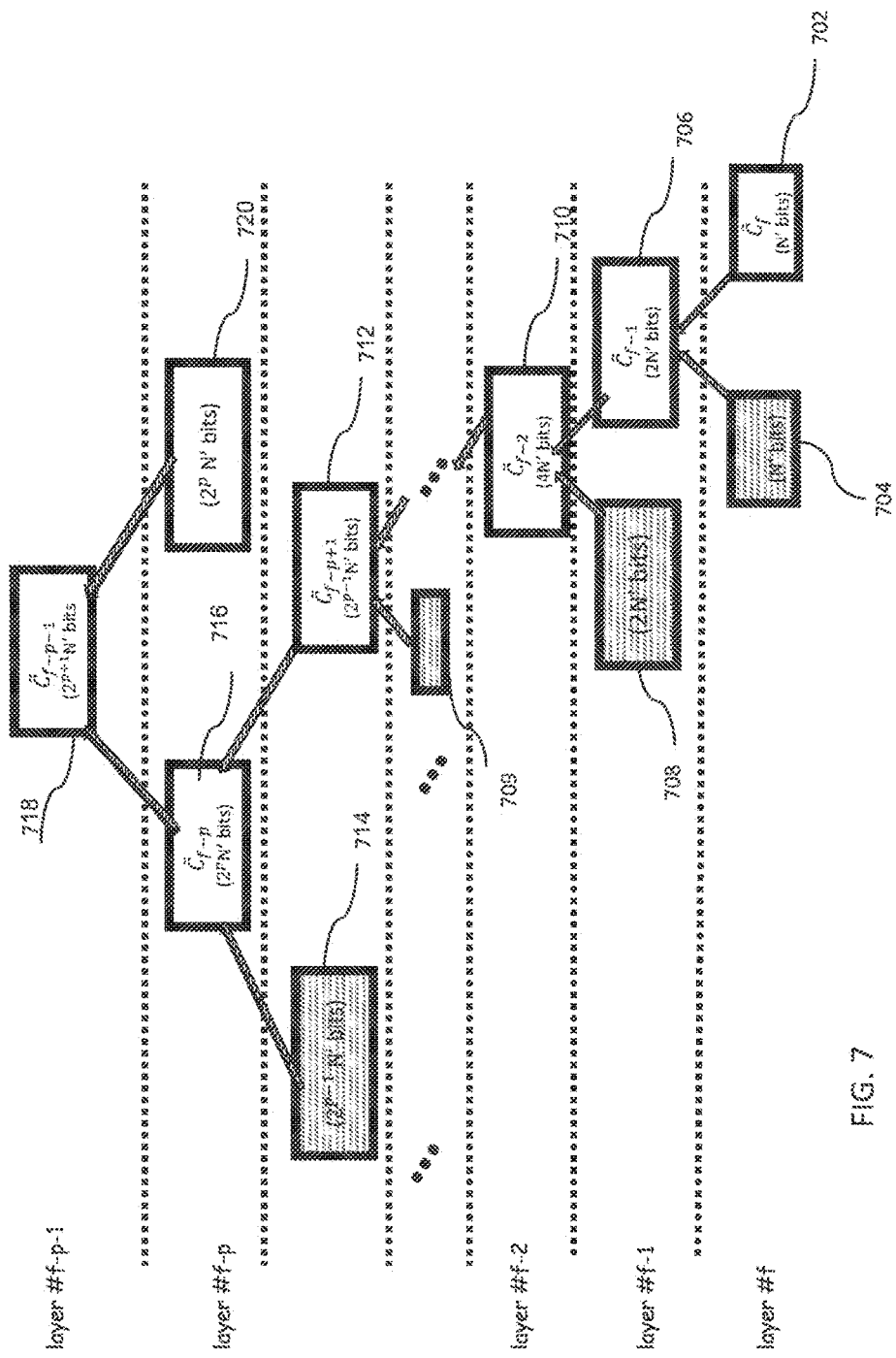
FIG. 7 illustrates a layered factor graph of a polar code according to its constituent codes according to some embodiments of the presently disclosed subject matter.

Attention is now directed to FIG. 7 which illustrates a layered factor graph of a polar code according to its constituent codes according to some embodiments of the presently disclosed subject matter. FIG. 7 gives emphasis to a particular sequence of constituent codes which are reencoded consecutively when the polar code is decoded using the method described above with reference to FIGS. 4-5.

Specifically, FIG. 7 illustrates a series of constituent codes which will be reencoded sequentially (one after the other) following the decoding of $\tilde{C}_f$ (702).

Leaf code $\tilde{C}_f$ (702) is outer-code #1 of its parent code $\tilde{C}_{f-1}$(706). Similarly, at the layer above the leaf layer, $\tilde{C}_{f-1}$ (706) is outer-code #1 of its parent code $\tilde{C}_{f-2}$ (710). The pattern in which each parent code in each next-higher layer is outer-code #1 of its parent code continues at each layer (f-2), (f-3) etc. until layer (f-p).

It is noted that—as described above with reference to FIG. 4—for each of layers f to (f-p-1), by the time that the decoder begins its decoding of $\tilde{C}_f$(702), $\tilde{C}_{f-1}$ (706) etc. the decoder has already selected the candidate codewords for the preceding sibling code.

At layer (f-p), Code $\tilde{C}_{f-p}$ (716) is outer-code #0 of $\tilde{C}_{f-p-1}$ (718), and its sibling outer-code #1 (denoted by 720) is as of yet undecoded. Thus $\tilde{C}_{f-p}$ (716) is the first "ancestor" code of code $\tilde{C}_f$ (702) that has an undecoded sibling.

The following observations are made regarding the execution of the decoder described in FIGS. 4-5 in the scenario of FIG. 7:

Subsequent to the decoding of constituent code $\tilde{C}_f$(702), the decoder will execute reencodings of candidate information words for each of the constituent codes $\tilde{C}_f$ (702), $\tilde{C}_{f-1}$(706), $\tilde{C}_{f-2}$ (710), etc. and then finally $\tilde{C}_{f-p}$ (716). These reencodings take place sequentially (e.g. the reencoded candidates $\tilde{C}_{f-1}$(706) are dependent on the reencoded candidates for $\tilde{C}_f$(702)), and these reencoding operations can result in corresponding quantities of processing latency.

Subsequent to the reencoding (470) of constituent code $\tilde{C}_{f-p}$ (716), the decoder will (at layer f-p-1) utilize the resulting candidate codewords to compute likelihood estimates (420) for use in decoding constituent code 720, which again results in processing latency.

Figure 8:
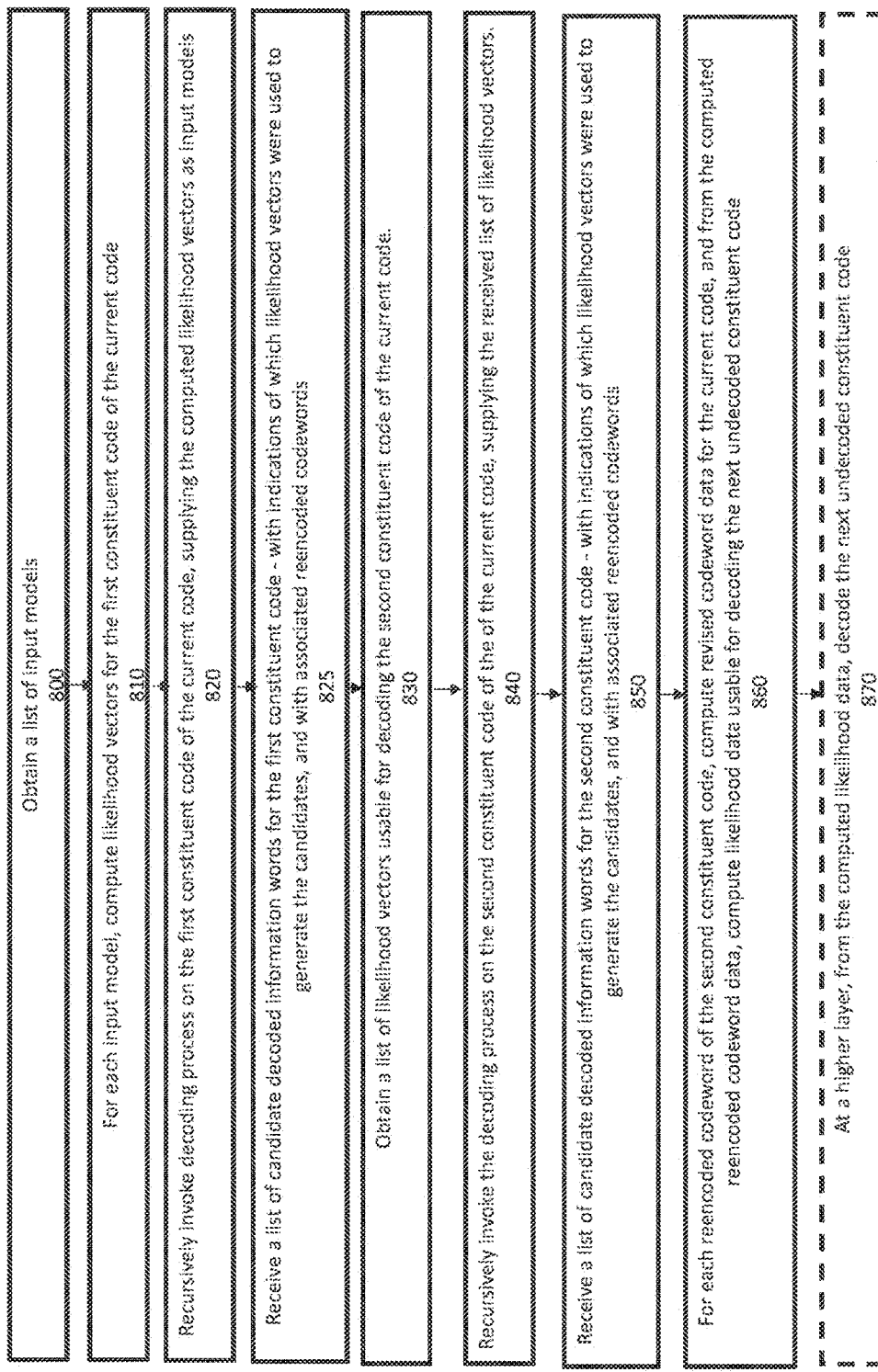
FIG. 8 illustrates an exemplary flow diagram of a low latency sequential list decoding process for polar codes, according to some embodiments of the presently disclosed subject matter.

Attention is now drawn to FIG. 8, which illustrates an exemplary flow diagram of a low latency sequential list decoding process for polar codes, according to some embodiments of the presently disclosed subject matter. The process is described, by way of non-limiting example, for an implementation utilizing the structure illustrated in FIG. 2. However, it is to be understood that the method can be embodied on various implementation platforms.

For convenience, the process is herein described for a binary alphabet, but it will be clear to one skilled in the art that the process is equally applicable for a non-binary alphabet.

The process utilizes example, characteristics inherent in operations used for polar encoding in conjunction with, for example, a multiple processing element architecture such as, for example, the system described above with reference to FIG. 2.

Among the features of the FIG. 8 process can be the following:

Efficient utilization of processing elements 235 to progressively compute the likelihood vectors for the next undecided constituent code (in the example shown in FIG. 7: a sibling (720) of an ancestor constituent code (716)) in addition to the reencoding performed at each layer.

The computation of these likelihood vectors can, for example, execute in parallel with a reencoding operation.

Among the advantages of some embodiments of the method are low latency decoding, low power consumption, and low memory usage requirements.

The process described in FIG. 8 is (like the process described, in FIG. 4) a recursive decoding method, and can be based on a layered factor graph. The process can thus begin by operating on the uppermost code of the layered factor graph (for example, $\tilde{C}_{f-p-1}$ 718 in the top layer of FIG. 7), and subsequently (via recursive invocation) operate on codes shown in lower layers.

The process can begin its processing of a particular code by obtaining (800) a list of input models. As described above with reference to FIG. 4, input models are vectors of symbol likelihoods applicable to the current code, and can be derived from, for example, information received from a communications medium, or from an earlier invocation of the process which recursively initiated the current invocation. As noted above with reference to FIG. 4, each input model is associated with a particular set of decoding decisions made on previous constituent codes, and these decisions can be—in some embodiments—stored in an information prefix in memory.

Next, for each of the input models, the process can compute likelihood vectors (810) for the first constituent code of the current code, Referring, by way of non-limiting example, to the layered, factor graph of FIG. 7: if the current code is, for example, $\tilde{C}_{f-p}$ 716 in layer f-p, the first constituent code 714 is located in layer f-p+1.

In some embodiments of the present subject matter, the likelihoods can be computed and maintained, for example, as base-2 logarithms—in this case they are referred to as log-likelihoods (LLs). In such embodiments, LL vectors for a particular first constituent code can be computed, for example, according to the following formulae:

$$LLH0[t] = addLL(InputLLH0[t] + InputLLH0[t + N/2],$$
$$InputLLH1[t] + InputLLH1[t + N/2])$$
$$LLH1[t] = addLL(InputLLH1[t] + InputLLH0[t + N/2],$$
$$InputLLH0[t] + InputLLH1[t + N/2])$$
$$\text{for } \forall t \in \left\{0, 1, 2 \ldots \frac{N}{2} - 1\right\}$$

where:
LLH0 is a vector indicating the log likelihoods that particular bits (identified by bit index t) of the first constituent code were transmitted as '0'.
LLH1 is a vector indicating the log likelihoods that particular bits (identified by bit index t) of the first constituent code were transmitted as '1'.
InputLLH0 is an input model vector denoting the log likelihoods that particular bits of the current code (identified by bit index t) were transmitted as '0'.
InputLLH1 is an input model vector denoting the log likelihoods that particular bits of the current code (identified by bit index t) were transmitted as '1'.
addLL($\alpha$, $\beta$)=max($\alpha,\beta$)+$\log_2(1-2^{-|\alpha-\beta|})$
N is the length in bits of the current code.

Returning to the example of constituent code 714 in FIG. 7: each LL in the resulting LL vectors LLH0 and LLH1 can represent the likelihood that a corresponding transmitted bit in the codeword for constituent code 714 was a '0' or a '1' respectively.

Next, the process can recursively invoke (820) a decoding process (for example: the current decoding process of FIG. 8, or a leaf code decoding process such as the one described above with reference to FIG. 5) on the first constituent code. The process can supply the pairs of newly computed likelihood, vectors(i.e. the LLH0 and LLH1 computed for each input model) to be utilized as a list of new input models in the recursively invoked decoding process in the next-lower layer. The recursively invoked decoding process can, for example, execute until its completion.

Following the completion of the recursively invoked decoding, the process can receive (825) the results of the recursive decoding. These results can, for example, include:
a list of candidate decoded information words for the first constituent code of the current code
for each candidate decoded information word:
a codeword consisting of the reencoding of the candidate decoded information word
a pointer, index, or some other indication denoting the particular pair of likelihood vectors (from the list of likelihood vector pairs that were supplied as input models) that were used to generate and select the candidate decoded information word.

Thus, in the example of FIG. 7, where the current code is $\tilde{C}_{f-p}$ 716, the data received from decoding the first constituent code 714 can include:
a list of candidate decoded information words for constituent code 714
for each one of the constituent code 714 candidate decoded information words in the received list:
the reencoded candidate decoded information word (i.e. a codeword of constituent code 714 hereforward termed a candidate codeword (CCW))
a pointer, index, or some other indication denoting the LLH0 and LLH1 (from the list of likelihood vector pairs that was supplied as input) that were used to generate the candidate decoded information word.

The process can next obtain (830)—for each candidate decoded information word in the received list—associated likelihood vectors usable for decoding the second constituent code of the current code.

In some embodiments of the presently disclosed subject matter, the process can receive these likelihood vectors usable for decoding the second constituent code of the current code from the recursively invoked decoding process which just completed. For example, when the recursively invoked decoding is according to FIG. 8, these likelihood vectors are returned to the invoking process. The details of this calculation are described hereinbelow.

In some embodiments of the presently disclosed subject matter, the recursively invoked decoding process might not provide the likelihood vectors for use in decoding the second constituent code of the current code (for example, if the process of FIG. 5 was invoked e.g. in the case of a "leaf code" constituent code). In such cases, the process decoding the current code can compute the likelihood vectors for use in decoding the second constituent code. The likelihood vectors can be computed according to the candidate codewords received from the recursive decoding of the first constituent code.

In an embodiment where likelihoods are represented and stored as a base-2 logarithm, the likelihood vectors can be computed, for example, according to the following formulae:

$$LLH0[t] = \begin{cases} InputLLH0[t] + InputLLH0\left[t + \frac{N}{2}\right] & \text{if } CCW[t] == 0 \\ InputLLH1[t] + InputLLH0\left[t + \frac{N}{2}\right] & \text{if } CCW[t] == 1 \end{cases}$$

$$LLH1[t] = \begin{cases} InputLLH1[t] + InputLLH1\left[t + \frac{N}{2}\right] & \text{if } CCW[t] == 0 \\ InputLLH0[t] + InputLLH1\left[t + \frac{N}{2}\right] & \text{if } CCW[t] == 1 \end{cases}$$

$$\text{for } \forall t \in \left\{0, 1, 2 \ldots \frac{N}{2} - 1\right\}$$

where CCW is a re-encoded codeword candidate of the first constituent code and other parameters are as described for the previous likelihood vectors computation (810).

Next, the process can again recursively invoke (840) a decoding process—this time on the second constituent code.

The newly computed likelihood vectors (e.g. the LLH0 and LLH1 pairs that have just been computed) can be supplied as the input models to the recursively invoked decoding process. As before (820), the current decoding process of FIG. 8, or a leaf code decoding process such as the one described above with reference to FIG. 5 may, for example, be invoked.

As before, following the completion of the recursively invoked decoding, the process can receive the results of the recursive decoding. Specifically, the process can receive (850), for example:
- a list of candidate decoded information words for the second constituent code of the current code
- for each candidate decoded information word:
    - a codeword consisting of the reencoding of the candidate decoded information word
    - a pointer, index, or some other indication denoting the particular pair of likelihood vectors (from the list of likelihood vector pairs that was supplied as input) resulted in the candidate decoded information word. Note that each pair of likelihood vectors is implicitly associated with the codeword of the first constituent code which was used to generate it.

Thus, in the FIG. 7 example where the current code is $\tilde{C}_{f\text{-}p}$ 716 and the second constituent code is $\tilde{C}_{f\text{-}p+1}$ 712 the data received can include:
- a list of candidate decoded information words for $\tilde{C}_{f\text{-}p+1}$ 712
- for each one of the $\tilde{C}_{f\text{-}p+1}$ 712 candidate decoded information words in the received list:
    - the reencoded candidate decoded information word (i.e. a CCW of $\tilde{C}_{f\text{-}p+1}$ 712)
    - a pointer, index, or some other indication denoting the LLH0 and LLH1 (from the list of likelihood vector pairs that was supplied as input) that was used to generate the candidate decoded information word.

Next, the process can compute (860)—for each reencoded candidate decoded information word of the second constituent code—revised codewords for the current code and likelihoods for the next undecoded constituent code, as described in more detail below with reference to FIG. 9.

Subsequently, in a higher layer, the decoder (for example: the candidates generator unit 240) can use the computed likelihoods to decode the next undecoded constituent code.

Figure 9:
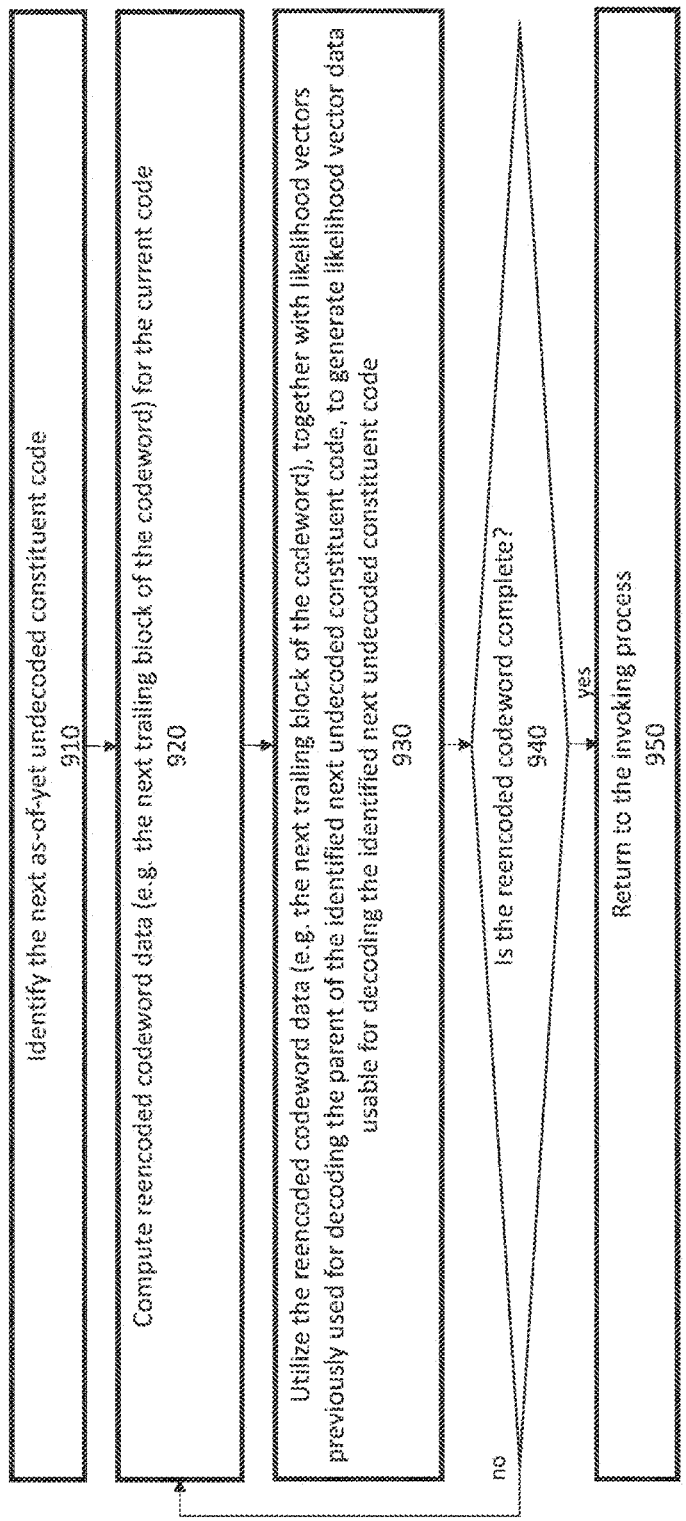
FIG. 9 illustrates an exemplary flow diagram of a process for low latency computation of reencoded codewords and likelihood estimations, according to some embodiments of the presently disclosed subject matter.

Attention is now drawn to FIG. 9, which illustrates an exemplary flow diagram of a process for low latency computation of reencoded codewords and likelihood estimations, according to some embodiments of the presently disclosed subject matter.

In some embodiments of the presently disclosed subject matter, the process illustrated in FIG. 9 can—given a list of CCWs and associated input models for the two child constituent codes—be used to compute (860) revised codeword data for the current code, and compute likelihood data usable for decoding the next undecoded constituent code as described above with reference to FIG. 8.

The decoder 200, (for example the controller unit 210) can identify (910) a constituent code as the next as-of-yet undecoded constituent code. The decoder can determine this, for example, according to a layered factor graph of the code such as the one illustrated above with reference to FIG. 3, and according to its current decoding state. A layered factor graph or a sequence of constituent codes for decoding can, for example, be part of the software code or a silicon implementation that executes the steps of the process.

Referring, by way of non-limiting example, to the layered factor graph and decoding sequence illustrated in FIG. 7: after the decoder 200 (for example: candidate generator unit 240 and selector unit 245) has completed generation and selection of CIWs (and associated CCWs) for constituent code $\tilde{C}_f$, the decoder (for example: reencoder unit 240) has the information necessary to perform—for each CCW—the reencoding of the code $\tilde{C}_{f\text{-}1}$. Before proceeding with this reencoding, the decoder 200 (for example: controller unit 210) can, for example, examine its state and data structures and determine that constituent codes $\tilde{C}_{f\text{-}2}$, $\tilde{C}_{f\text{-}3}$, etc. have already been decoded and—similar to the code $\tilde{C}_{f\text{-}1}$ itself—require only reencoding steps. In this particular non-limiting example the decoder 200 (for example: controller unit 210) can then determine that the second child code of $\tilde{C}_{f\text{-}p-1}$ (i.e. constituent code 720) is the next undecoded constituent code. It is noted that, in some embodiments of the presently disclosed subject matter, the parent of the next undecoded constituent code is also an ancestor of the currently decoded constituent code.

Next, the decoder 200 (for example: (reencoder unit 270)) can, for example, compute (920)—for each CCW—a sequence of bits which constitutes a partial or complete result of the application of the polar code's inner code mapping on the CCW together with the sibling constituent code CCW from which it was derived (as described above with reference to FIG. 4). This computation results, for example, in a reencoded codeword of the current constituent code.

In some embodiments of the presently disclosed subject matter, the decoder 200 (for example: the reencoder unit 270) can compute the bits of the reencoded codeword according to the following formula:

$$CW[t] = CW\text{-}OC0[t] \text{ xor } CW\text{-}OC1[t]$$
$$CW[t+N/2] = CW\text{-}OC1[t] \quad \forall t \in \left\{0, 1, \ldots, \frac{N}{2}-1\right\}$$

where CW denotes the codeword of the current constituent code, CW-OC1 denotes the candidate codeword of the second child constituent code, and CW-OC0 denotes the candidate codeword of the first child constituent code that generated the likelihood vectors that generated CW-OC1). Here N denotes the length of the current code (in bits) and t denotes a bit index.

In some embodiments of the presently disclosed subject matter, the decoder 200 (for example: the reencoder unit 270) can compute a bit sequence consisting of fewer bits than the total number of bits in the reencoded codeword (i.e. in these embodiments the sequence of bits constitutes a partial result of reencoding). The decoder 200 can be limited in the number of bits that it can output, and thus output less than a full codeword in circumstances where, for example, the codeword is comparatively long. The term "block" hereforward denotes such a computed group of ordered bits (or more generally: symbols) that is smaller than the length of the target codeword. The term lBlock hereforward denotes the number of bits (or symbols) in a block. In such embodiments, the decoder 200 (for example: (reencoder unit 270)) can require several iterations of block computation to compute the complete sequence of blocks that constitutes the reencoded candidate codeword (for example: $(2^p N')$/lBlock iterations, where p denotes the number of layers from the leaf constituent code to the parent code being reencoded—as illustrated in FIG. 7).

In some embodiments of the presently disclosed subject matter, lBlock can be, for example, equal to NPE (i.e. to the number of processing elements 235 contained within the decoder 200 as described above with reference to FIG. 2). In such embodiments, efficient use of pipelining for low latency reencoding can be enabled, as is described in detail hereinbelow.

In some embodiments of the presently disclosed subject matter, the decoder 200 (for example: reencoder unit 270) first computes the block that corresponds to the sequentially last bits of the reencoded codeword. In the subsequent iteration, the decoder 200 (for example: reencoder unit 270) can then—in such an embodiment—compute the block corresponding to the bits sequentially preceding the block of the first iteration. For example, in an embodiment where codeword length is 16 bits and lBlock is 4 bits, the decoder 200 (for example: reencoder unit 270) can first compute bits 12:15 i.e. the final 4 bits of the codeword, in the next iteration, the decoder 200 (for example: reencoder unit 270) can then compute bits 8:11 etc. The term "trailing block" is hereforward used to denote a block generated in this manner. The term "next trailing block" is hereforward used to denote the block of the codeword that is the next to be generated in an embodiment where blocks are being generated in this manner. The term "upper-to-lower order" is hereforward used to denote the generation of blocks of reencoded candidate codewords in this manner.

In some embodiments of the presently disclosed subject matter, the decoder 200 (for example: reencoder unit 270) can store (930) the computed reencoded codeword data (for example: the trailing block) to, for example, a memory location associated with the reencoded codeword. In some embodiments of the presently disclosed, subject matter, the memory location can be, for example, a regular memory, a high-speed low-latency memory, or even a temporary memory that is used only until the codewords of the parent code have been calculated. The decoder 200 (for example: reencoder unit 270) can in this manner simply store the entire reencoded codeword by storing the blocks to memory—one block at a time.

In some embodiments of the presently disclosed subject matter, the decoder 200 (for example: reencoder unit 270) can—in addition—store the computed reencoded codeword data (for example: the trailing block) to, for example, a memory location associated with a reencoded codeword of the constituent code that is the sibling of the identified next undecoded constituent code.

Next, e decoder 200 (for example: the processing elements 235) can utilize (920) the computed reencoded codeword data (for example: the trailing block), together with the likelihood vectors that were previously used in decoding the parent of the identified next undecoded constituent code, in order to generate likelihood estimates for (at least) a portion of the bits of the identified next undecoded constituent code.

In some embodiments of the presently disclosed subject matter, the partial log likelihood vector data can be computed according to the following formula:

$$LLH0\_for\_Next\_Undecoded[StartingOffset + t] = \begin{cases} Parent\_InputLLH0[StartingOffset + t] + \\ Parent\_InputLLH0\left[StartingOffset + t + \frac{N}{2}\right] & \text{if } CCW[t] == 0 \\ Parent\_InputLLH1[StartingOffset + t] + \\ Parent\_InputLLH0\left[StartingOffset + t + \frac{N}{2}\right] & \text{if } CCW[t] == 1 \end{cases}$$

$$LLH0\_for\_Next\_Undecoded[StartingOffset + t] = \begin{cases} Parent\_InputLLH1[StartingOffset + t] + \\ Parent\_InputLLH1\left[StartingOffset + t + \frac{N}{2}\right] & \text{if } CCW[t] == 0 \\ Parent\_InputLLH0[StartingOffset + t] + \\ Parent\_InputLLH1\left[StartingOffset + t + \frac{N}{2}\right] & \text{if } CCW[t] == 1 \end{cases}$$

for $\forall t \in \{0, 1, 2 \ldots N - 1\}$ where:
  LLH0_for_Next_Undecoded[ ] and LLH1_for_Next_Undecoded[ ] are the calculated log likelihood vectors to be used for decoding the identified next undecoded constituent code.
  Parent_InputLLH0[ ] and Parent_InputLLH1[ ] refer to the input model log likelihoods (received for example from a communications medium or prior recursive invocation as described above with reference to FIG. 4) of the constituent code that is the parent of the next as-of-yet undecoded constituent code.
  StartingOffset refers to the offset in the likelihoods vector where the beginning of likelihood data should be written. In some embodiments of the presently disclosed subject matter, StartingOffset correspond to the beginning of the likelihood data which is dependent on the codeword data decoded at the current layer.

It is noted that the computation of the likelihood data (930) performed by, for example, the processing elements 235 may start as soon as codeword data generated by, for example, the reencoder unit 270 (as part of reencoding (920)) is available. It is noted that if a block of codeword data contains NPE bits, then the NPE processing elements 235 can execute in parallel so that each processing element 235 of the NPE processing elements 235 simultaneously calculates the likelihood for a single bit of the identified next undecoded codeword.

In some embodiments of the presently disclosed subject matter, the likelihood data computation can start at Δ clock-cycles after the re-encoding sequence started—resulting in the effective latency due to re-encoding being equivalent to Δ.

In some embodiments of the presently disclosed subject matter, Δ=0. In suet embodiments, likelihood data computation starts in the same clock-cycle that re-encoding starts.

In some embodiments of the presently disclosed subject matter, Δ=1. In such embodiments, likelihood data computation (930) starts in the clock-cycle following the start of the re-encoding (920). In such embodiments, the reencoding unit 270 can compute the next trailing block concurrent to the computation by the processing elements 235 of the likelihoods for the preceding trailing block.

Whether Δ=0 or a higher value, the computation time of the decoding can be reduced compared to the method illustrated above with reference to FIG. 6, as the pipelining of the reencoding and subsequent likelihood computation steps has enabled increased efficiency.

Next, the decoder 200 (for example: (controller unit 210)) determines (940) whether the complete codeword has been generated. If not, then the decoder 200 (for example: (reencoder unit 270)) can, for example, compute (920) the next trailing block. If the complete codeword has been generated, then the process is complete (950), and the decoder 200 can, for example, process a subsequent candidate codeword from the list.

In some embodiments of e presently disclosed subject matter, pipelining can similarly be implemented between reencoding (530) of CIWs of the first child constituent code resulting in CCWs and obtaining (830) of likelihood vectors for the second child constituent code based on the CCWs. As described above, in this case the decoder 200 (for example: (reencoder unit 270)) can iteratively reencode the next trailing block, and this data can be pipelined to, for example, NPE processing elements 235 operating in parallel to calculate likelihood vector values as described above with reference to FIG. 4.

Figure 10:
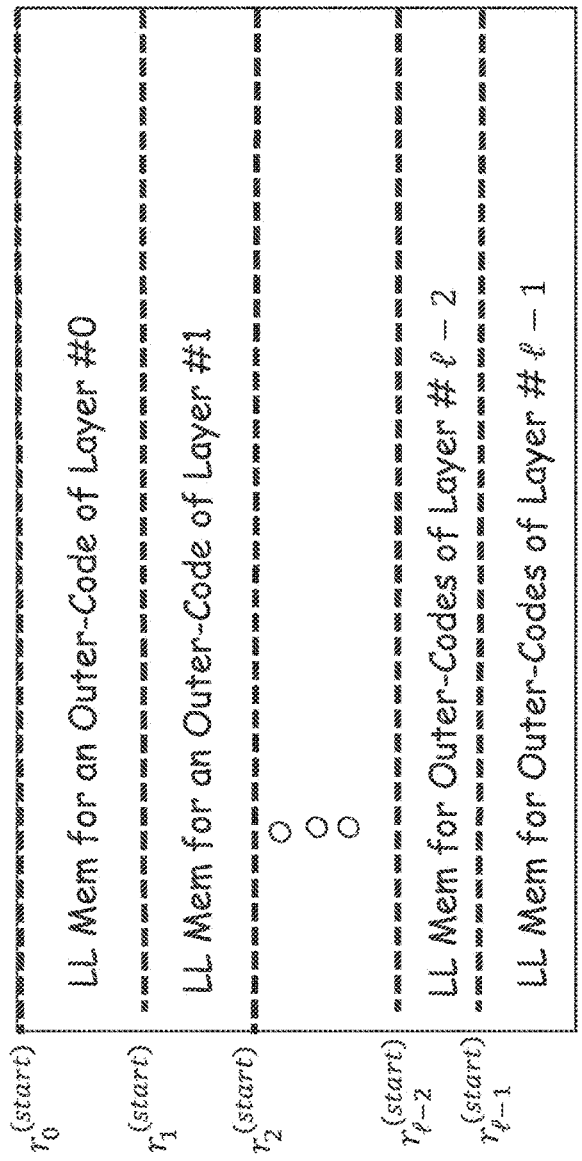
FIG. 10 illustrates an exemplary layout of a memory table for storing likelihood data, according to some embodiments of the presently disclosed subject matter.

Attention is now directed to FIG. 10, which illustrates an exemplary layout of a memory table for storing likelihood data, according to some embodiments of the presently disclosed subject matter.

The memory structures illustrated in FIG. 10-14 and described hereinbelow are exemplary and are not required to execute the processes described above, with reference to FIGS. 4-5 and FIGS. 8-9.

The structure of the exemplary memory table storing likelihood data is hereforward termed LLMem.

The maximum number of LLs stored in a row of LLMem can be, for example, 2·NPE. LLMem can be divided into regions, and each region can be allocated to computations pertaining to a different layer of the layered factor graph of the code being decoded. In some embodiments of the presently disclosed subject matter, a single outer-code belonging to a given layer can be in the state of active decoding at a given time.

Thus, in some embodiments of the presently disclosed subject matter, only the likelihoods of a single outer-code in a given layer are required to be stored at any given time in LLMem.

$r_0^{(start)}$, $r_1^{(start)}$, ..., $r_{\ell-1}^{(start)}$ denote the beginning addresses of the LLMem regions for layers #0, #1, ..., #$\ell$-1, respectively.

LLMem[$r_i^{(start)}$: ($r_{i+1}^{(start)}$-1)] is the memory storing the likelihoods for an outer-code of layer i that is currently being decoded by the decoder 200 (for a code of length N, this outer-code has length $$\frac{N}{2^i}$$

bits).

Attention is now directed to FIG. 11, which illustrates an exemplary layout of rows in a region of the memory table for storing likelihood data of multiple input models which pertain to a single outer code, according to some embodiments of the presently disclosed subject matter.

A series of memory rows in the region of an outer-code in a particular layer can store likelihoods for a single input model of that outer-code. For each input model, the number of rows maintained is hereforward denoted as $\theta_i$ (and is equivalent to $$\frac{N}{2^{i+1} \cdot NPE}).$$

Consequently, for a maximum list size of L, there are L·$\theta_i$ rows in LLMem for layer i, located in the memory range LLMem[$r_i^{(start)}$: ($r_{i+1}^{(start)}$-1)]. The first $\theta_i$ rows contain LL data of the first input model, and the next ones are for LLs of the second input model etc.

Figure 12:
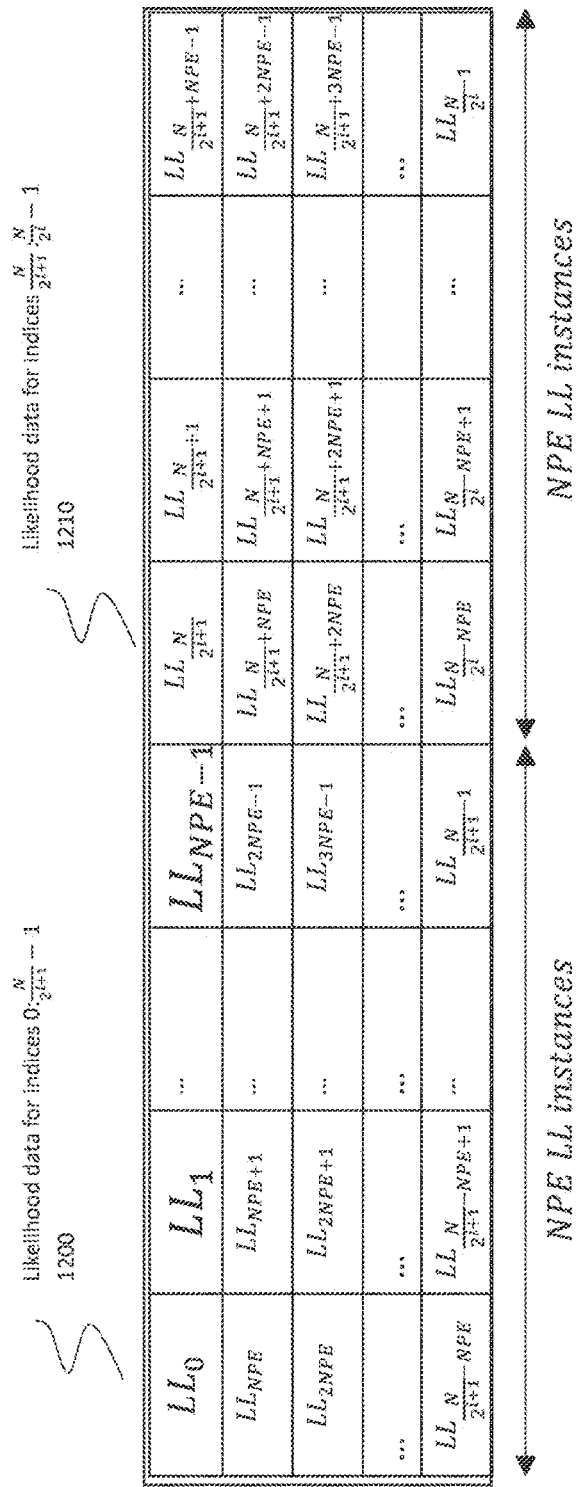
FIG. 12 illustrates an exemplary layout of a row of a memory table for storing likelihood data, according to some embodiments of the presently disclosed subject matter.

Attention is now directed to FIG. 12, which illustrates an exemplary layout of a row of a memory table for storing likelihood data, according to some embodiments of the presently disclosed subject matter.

Each LLMem memory row can consist, for example, of (2·NPE·nLLBits) bits, where nLLBits is the number of bits assigned to represent, for example, likelihood, log-likelihood, or log-likelihood ratio values.

For example LLMem[i][(nLLBits·(j+1)−1):j·nLLBits] corresponds to the $j^{th}$ likelihood value in row i.

In some embodiments of the presently disclosed subject matter, the memory within a row is organized so that the row contains all the necessary input data to compute likelihoods for NPE bits of the codeword.

Within memory rows for a particular input model, row m can contain the likelihoods corresponding to the symbol indices from (m·NPE) to ((m+1)·NPE−1) and also to bits $$\left(\frac{N}{2^{i+1}} + m \cdot NPE\right)$$

up to $$\left(\frac{N}{2^{i+1}} + (m+1) \cdot NPE - 1\right).$$

The likelihood data with index 1210 pertains to the first range (whereas the likelihood data with index 1200 pertains to the second range).

Figure 13:
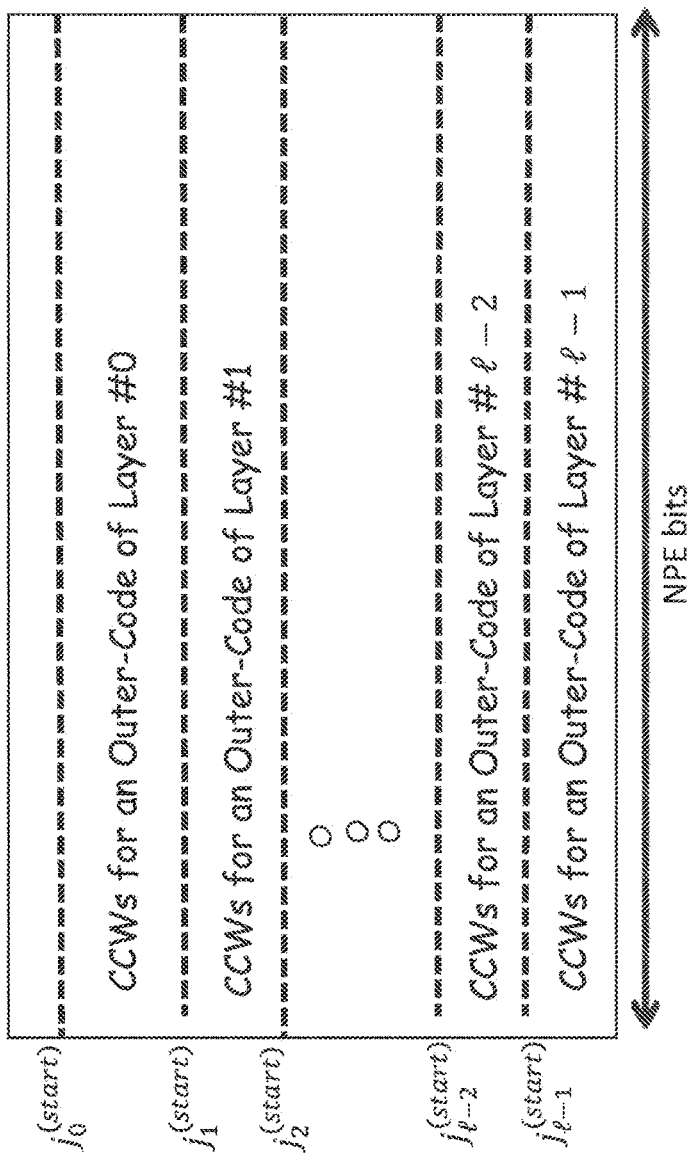
FIG. 13 illustrates an exemplary layout of a memory table for storing candidate codewords (CCWs), according to some embodiments of the presently disclosed subject matter.

Attention is now directed to FIG. 13, which illustrates an exemplary layout of a memory table for storing candidate codewords (CCWs), according to some embodiments of the presently disclosed subject matter. The structure of the exemplary memory table storing likelihood data is hereforward termed CWMem.

CWMem is divided into regions—each region is utilized for computations of a different outer-code (at any given time, at most one outer-code per layer in the layered factor graph of the code is actively used for computations). $j_0^{(start)}$, $j_1^{(start)}$, ..., $j_{\ell-1}^{(start)}$ denote the beginning address of layers #0, #1, ..., #$\ell$-1, respectively. CWMem [$j_i^{(start)}$: ($j_{i+1}^{(start)}$−1)] are the memory rows containing data outer-code of layer i (of length $$\frac{N}{2^i}$$

bits).

Attention is now directed to FIG. 14, which illustrates an exemplary layout of rows in a region of the memory table for storing codeword data of multiple input models which pertain to a single outer code, according to some embodiments of the presently disclosed subject matter.

Each row in CWMem contains NPE bits. Each bit in the row corresponds to a codeword bit. Consecutive $2\theta_i$ rows of CWMem contain an outer-code decision for a single model of that outer-code. Consequently if the maximum list size is L, there is a total of $L \cdot 2\theta_i$ rows for layer i, located in CWMem $[j_i^{(start)}: (j_{i+1}^{(start)}-1)]$. The first $2\theta_i$ rows are for the first model, and the next ones are for the second model etc.

The organization of the memory within the row can be such that each row provides complete input to NPE LL preparation operations.

Within the memory of a particular model, row m contains bits decisions for codeword symbols with indices of $m \cdot NPE$ up to $(m+1) \cdot NPE - 1$.

CWMem is used together with LLMem to generate the LL values for outer-codes subsequent to the first in each layer. To accomplish this, the LLMem of layer #i is used with outer-codes of layer #(i+1), As a consequence, a single row of LLMem and a single row of CWMem are used for generating a new single row of LLMem as preparation for decoding outer-code #1.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described without departing from its scope, defined, in and by the appended claims.

The invention claimed is:

1. A method of recursive sequential list decoding of a codeword of a polar code, the method provided by a decoder comprising a plurality of processors, the method comprising:
   a) obtaining, by the decoder, an ordered sequence of constituent codes usable for the sequential decoding of the polar code, the constituent codes being representable by a layered graph;
   b) generating, by the decoder, data informative of a first candidate codeword (CCW) of a first constituent code, the first CCW being computed from an input model informative of a CCW of a second constituent code and being associated therewith, the first constituent code and second constituent code being children of a third constituent code;
   c) using the data informative of the first CCW and the data informative of the second CCW to compute, by the decoder, data indicative of a CCW of the third constituent code;
   d) using the data indicative of the CCW of the third constituent code to compute, by the decoder, a group of symbol likelihoods, each symbol likelihood being usable to derive a probability that a specific symbol of a fourth constituent code was transmitted with a particular symbol value, the fourth constituent code being part of a layer higher than the layer of the third constituent code, the parent of the fourth constituent code being an ancestor of the third constituent code; and
   e) using the group of symbol likelihoods to decode, by the decoder, the fourth constituent code.

2. The method of claim 1, wherein the computing a group of symbol likelihoods is executed on at least one processor of the plurality of processors.

3. The method of claim 2, wherein the computing data indicative of a CCW of the third constituent code comprises generating, by the decoder, a sequence of one or more groups of ordered CCW symbols, each group of ordered CCW symbols having a group length, the symbols in a given group being generated by the decoder within a single clock cycle.

4. The method of claim 3, wherein the decoder generates the sequence of groups of ordered CCW symbols in upper-to-lower order.

5. The method of claim 4, wherein the at least one processor computes likelihoods for symbols of a first group of ordered CCW symbols concurrent with generation, by the decoder, of a subsequent group of ordered CCW symbols.

6. The method of claim 3, wherein the computing a group of symbol likelihoods comprises concurrently computing the likelihood of each symbol of a group of ordered CCW symbols on a distinct processor of the at least one processor.

7. The method of claim 6, wherein the at least one processor computes likelihoods for symbols of a group of ordered CCW symbols within a clock cycle during which the decoder generated the group.

8. A recursive sequential list decoder of a polar code, the decoder comprising a memory and a plurality of processors, wherein the decoder is configured to:
   a) obtain an ordered sequence of constituent codes usable for the sequential decoding of the polar code, the constituent codes being representable by a layered graph;
   b) generate data informative of a first candidate codeword (CCW) of a first constituent code, the first CCW being computed from an input model informative of a CCW of a second constituent code and being associated therewith, the first constituent code and second constituent code being children of a third constituent code;
   c) use the data informative of the first CCW and the data informative of the second CCW to compute data indicative of a CCW of the third constituent code;
   d) use the data indicative of the CCW of the third constituent code to compute a group of symbol likelihoods, each symbol likelihood being usable to derive a probability that a specific symbol of a fourth constituent code was transmitted with a particular symbol value, the fourth constituent code being part of a layer higher than the layer of the third constituent code, the parent of the fourth constituent code being an ancestor of the third constituent code; and e) use the group of symbol likelihoods to decode the fourth constituent code.

9. A computer program product comprising a computer readable storage medium retaining program instructions, which, when read by a processing circuitry, cause the processing circuitry to perform a method of recursive sequential list decoding of a codeword of a polar code, the method comprising:

a) obtaining, by the decoder, an ordered sequence of constituent codes usable for the sequential decoding of the polar code, the constituent codes being representable by a layered graph;

b) generating, by the decoder, data informative of a first candidate codeword (CCW) of a first constituent code, the first CCW being computed from an input model informative of a CCW of a second constituent code and being associated therewith, the first constituent code and second constituent code being children of a third constituent code;

c) using the data informative of the first CCW and the data informative of the second CCW to compute, by the decoder, data indicative of a CCW of the third constituent code;

d) using the data indicative of the CCW of the third constituent code to compute, by the decoder, a group of symbol likelihoods, each symbol likelihood being usable to derive a probability that a specific symbol of a fourth constituent code was transmitted with a particular symbol value, the fourth constituent code being part of a layer higher than the layer of the third constituent code, the parent of the fourth constituent code being an ancestor of the third constituent code; and e) using the group of symbol likelihoods to decode, by the decoder, the fourth constituent code.

* * * * *